United States Patent
Ren et al.

(10) Patent No.: US 12,432,041 B2
(45) Date of Patent: Sep. 30, 2025

(54) CODEWORD SYNCHRONIZATION METHOD, RECEIVER, NETWORK DEVICE, AND NETWORK SYSTEM

(71) Applicant: Huawei Technologies Co., Ltd., Shenzhen (CN)

(72) Inventors: Hao Ren, Beijing (CN); Xiang He, Beijing (CN); Xinyuan Wang, Beijing (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 417 days.

(21) Appl. No.: 17/961,000

(22) Filed: Oct. 6, 2022

(65) Prior Publication Data
US 2023/0023776 A1    Jan. 26, 2023

Related U.S. Application Data

(63) Continuation of application No. PCT/CN2021/086736, filed on Apr. 12, 2021.

(30) Foreign Application Priority Data

Apr. 10, 2020 (CN) .......................... 202010280832.9
May 19, 2020 (CN) .......................... 202010424884.9

(51) Int. Cl.
*H04L 7/04*    (2006.01)
*H03M 13/13*   (2006.01)
*H04L 1/00*    (2006.01)
*H04L 7/08*    (2006.01)

(52) U.S. Cl.
CPC ............ *H04L 7/042* (2013.01); *H03M 13/13* (2013.01); *H04L 1/0041* (2013.01); *H04L 1/0047* (2013.01); *H04L 1/0057* (2013.01); *H04L 7/08* (2013.01)

(58) Field of Classification Search
None
See application file for complete search history.

(56) References Cited

U.S. PATENT DOCUMENTS

| | | |
|---|---|---|
| 5,852,639 A | 12/1998 | Murakami |
| 7,447,236 B2 | 11/2008 | Manohar |
| 2003/0137928 A1 | 7/2003 | Kroeger et al. |

(Continued)

FOREIGN PATENT DOCUMENTS

| | | |
|---|---|---|
| CN | 1391743 A | 1/2003 |
| CN | 101542960 A | 9/2009 |

(Continued)

OTHER PUBLICATIONS

IEEE Std 802.3TM, "IEEE Standard for Ethernet," LAN/MAN Standards Committee of the, IEEE Computer Society, 2015, 5600 pages.

(Continued)

*Primary Examiner* — Walter J DiVito
(74) *Attorney, Agent, or Firm* — Conley Rose, P.C.

(57) ABSTRACT

A codeword synchronization method includes determining a candidate in a plurality of bits of a data sequence received by a receive end, and determining a synchronization position based on the candidate bit, where the synchronization position indicates a start position of a codeword in the data sequence.

30 Claims, 13 Drawing Sheets

(56) References Cited

U.S. PATENT DOCUMENTS

| | | | |
|---|---|---|---|
| 2009/0154623 A1 | 6/2009 | Houcke et al. | |
| 2010/0028009 A1 | 2/2010 | Leung et al. | |
| 2012/0110421 A1 | 5/2012 | Ganga et al. | |
| 2012/0294609 A1* | 11/2012 | Leung | H04L 7/042 398/43 |
| 2015/0249966 A1 | 9/2015 | Grelier et al. | |
| 2016/0149595 A1 | 5/2016 | Benjamini et al. | |
| 2019/0158214 A1* | 5/2019 | Howlader | H03M 13/23 |

FOREIGN PATENT DOCUMENTS

| | | |
|---|---|---|
| CN | 103004123 A | 3/2013 |
| CN | 104541182 A | 4/2015 |
| CN | 107040793 A | 8/2017 |
| CN | 110474718 A | 11/2019 |
| EP | 1209868 A2 | 5/2002 |
| EP | 2688241 A1 | 1/2014 |
| JP | 2001136158 A | 5/2001 |
| JP | 2004214743 A | 7/2004 |
| KR | 20070083636 A | 8/2007 |
| WO | 2013097174 A1 | 7/2013 |

OTHER PUBLICATIONS

IEEE Std 802.3-2018, IEEE Standard for Ethernet LAN/MAN Standards Committee of the, IEEE Computer Society, Approved Jun. 14, 2018, 5600 pages.

802.3bs-2017, IEEE Standard for Ethernet—Amendment 10: Media Access Control Parameters, Physical Layers, and Management Parameters for 200 Gb/s and 400 Gb/s Operation, 372 pages.

* cited by examiner

S221: A receive end selects a plurality of observed bits from a received data sequence S222: Select a candidate bit from the plurality of observed bits

FIG. 3

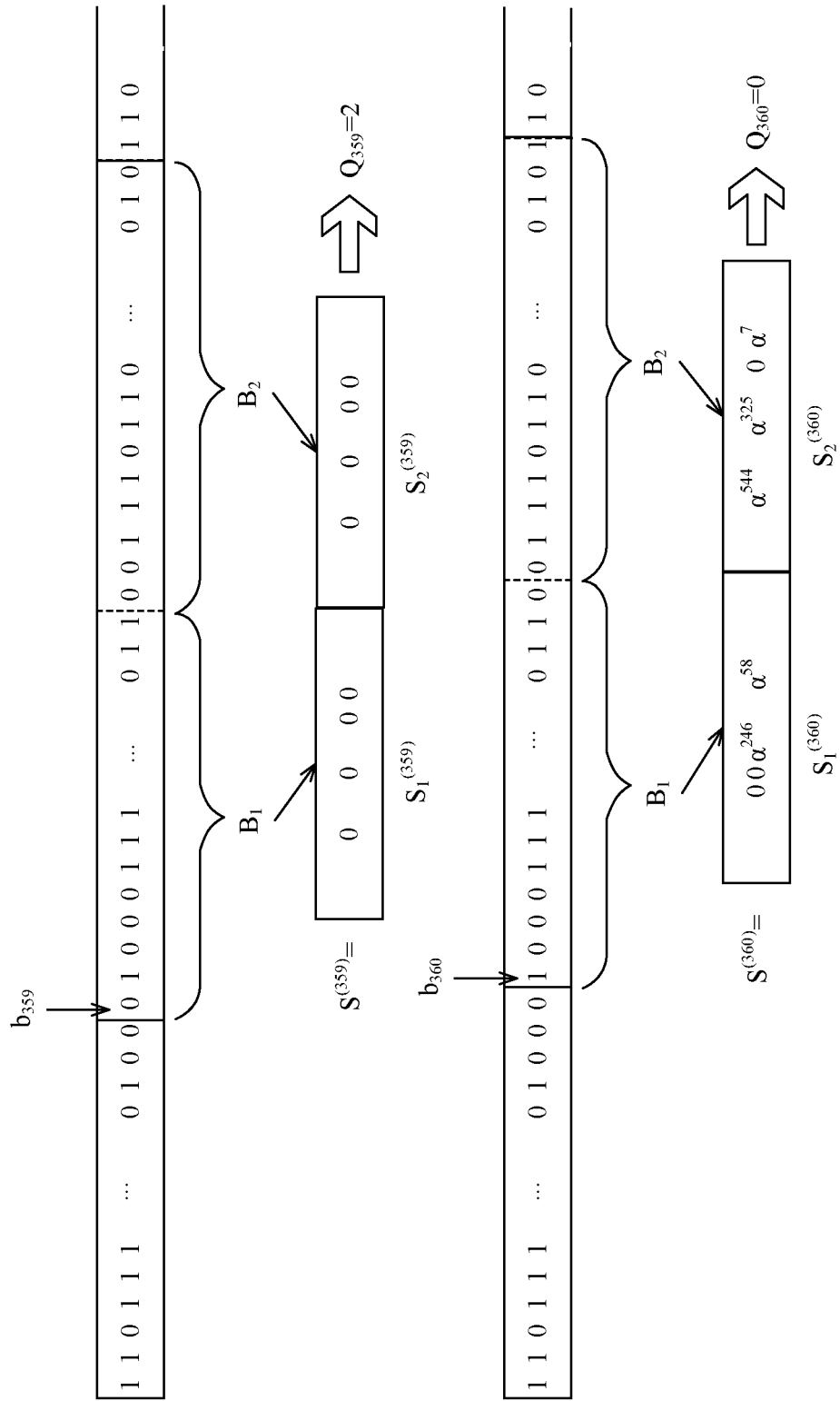

US 12,432,041 B2

CODEWORD SYNCHRONIZATION METHOD, RECEIVER, NETWORK DEVICE, AND NETWORK SYSTEM

CROSS-REFERENCE TO RELATED APPLICATIONS

This application is a continuation application of International Patent Application No. PCT/CN2021/086736, filed on Apr. 12, 2021, which claims priority to Chinese Patent Application No. 202010280832.9, filed on Apr. 10, 2020 and Chinese Patent Application No. 202010424884.9, filed on May 19, 2020. All of the aforementioned applications are hereby incorporated by reference in their entireties.

TECHNICAL FIELD

This application relates to the communication field, and in particular, to a codeword synchronization method, a receiver, a network device, and a network system.

BACKGROUND

With improvement of a production process level, channel loss and noise have become key factors that limit a data transmission rate and distance. Emergence of forward error correction (FEC) provides error correction protection for data in transmission, thereby increasing a data transmission rate and distance of a channel. The FEC may be classified into a block code and a convolutional code based on different processing manners for information sequences. The block code may be further sub-classified into a linear block code and a non-linear block code. Because encoding and decoding implementation of the linear block code is simple, the linear block code is widely used at a physical layer and a media access control sublayer of a data link layer in an Open Systems Interconnection (OSI) model of Ethernet.

Error detection and error correction functions of the linear block code need to be implemented based on a complete codeword. Therefore, a codeword boundary needs to be determined in a data stream. To be specific, a start and an end of a complete codeword need to be found. This process is referred to as codeword synchronization (codeword synchronization) or frame synchronization.

Currently, a synchronization solution applicable to the linear block code is available in the industry. An alignment marker (AM) synchronization solution used for 200/400 Gigabit Ethernet (GE) in the Institute of Electrical and Electronics Engineers (IEEE) 802.3 standard is used as an example. In this solution, a fixed AM sequence needs to be inserted at an interval of a codeword with a specific length, and a receive end can perform codeword synchronization by identifying the AM sequence. However, presence of the AM sequence is equivalent to insertion of additional data into a data stream at a transmit end, and therefore redundant information is added.

SUMMARY

This application provides a codeword synchronization method for self-synchronization, a receiver, and a network device, to resolve a technical problem that additional data is added in an AM synchronization solution.

According to a first aspect, this application provides a codeword synchronization method. The method includes steps including step 1: receiving a data sequence, where the data sequence includes a plurality of bits; step 2: determining a candidate bit in the data sequence, where the candidate bit is included in the plurality of bits; and step 3: determining a synchronization position based on the candidate bit, where the synchronization position indicates a start position of a codeword in the data sequence.

The method is performed by a receiving device on a network. With this method, a technical effect of high-precision codeword synchronization for a data stream at a receive end can be achieved without inserting additional data into a data stream at a transmit end, and synchronization performance achieves high reliability.

In a possible implementation, step 3 includes performing verification on the candidate bit, and when the verification succeeds, determining that a position of the candidate bit is the synchronization position.

In a possible implementation, at least one second test data block is obtained from the data sequence through division based on the candidate bit, where the position of the candidate bit is a start position of the at least one second test data block; and verification is performed on a characteristic value of the at least one second test data block, and when the verification succeeds, it is determined that the position of the candidate bit is the synchronization position.

In a possible implementation, that verification is performed on a characteristic value of the at least one second test data block includes: sequentially accumulating a characteristic value of each of the at least one second test data block to obtain a cumulative value, where when the cumulative value meets a synchronization condition, the verification succeeds.

In a possible implementation, the cumulative value of the characteristic values is a quantity of second test data blocks that are in the at least one second test data block and that are determined as correct codewords, and the synchronization condition is that the cumulative value is greater than or equal to a synchronization threshold; or the characteristic value is a quantity of all-zero syndromes in syndromes, and the synchronization condition is that the cumulative value is greater than or equal to a synchronization threshold; or the characteristic value is a quantity of zero elements in a syndrome, and the synchronization condition is that the cumulative value is greater than or equal to a synchronization threshold; or the characteristic value is a quantity of correctable test data blocks, and the synchronization condition is that the cumulative value is greater than or equal to a synchronization threshold; or the characteristic value is a quantity of test data blocks whose reconstructed parity bits are the same as received parity bits, and the synchronization condition is that the cumulative value is greater than or equal to a synchronization threshold, where a length of the test data block is n bits, the first k bits of the test data block are information bits, the last n−k bits of the test data block are the received parity bits, the reconstructed parity bits are obtained based on the information bits, a length of the reconstructed parity bits is n−k bits, and n and k are integers.

In a possible implementation, that verification is performed on a characteristic value of the at least one second test data block includes: adding up characteristic values of all of the at least one second test data block to obtain a total value, where when the total value meets a synchronization condition, the verification succeeds.

In a possible implementation, the total value of the characteristic values is a quantity of second test data blocks that are in the at least one second test data block and that are determined as correct codewords; or the total value of the characteristic values is a quantity of second test data blocks that are in the at least one second test data block and that are determined as incorrect codewords, and the synchronization condition is that the total value is less than or equal to a synchronization threshold; or the characteristic value is a quantity of all-zero syndromes in syndromes, and the synchronization condition is that the total value is greater than or equal to a synchronization threshold; or the characteristic value is a quantity of non-all-zero syndromes in syndromes, and the synchronization condition is that the total value is less than or equal to a synchronization threshold; or the characteristic value is a quantity of zero elements in a syndrome, and the synchronization condition is that the total value is greater than or equal to a synchronization threshold; or the characteristic value is a quantity of non-zero elements in a syndrome, and the synchronization condition is that the total value is less than or equal to a synchronization threshold; or the characteristic value is a quantity of correctable test data blocks, and the synchronization condition is that the total value is greater than or equal to a synchronization threshold; or the characteristic value is a quantity of uncorrectable test data blocks, and the synchronization condition is that the total value is less than or equal to a synchronization threshold; or the characteristic value is a quantity of test data blocks whose reconstructed parity bits are the same as received parity bits, and the synchronization condition is that the total value is greater than or equal to a synchronization threshold; or the characteristic value is a quantity of test data blocks whose reconstructed parity bits are different from received parity bits, and the synchronization condition is that the total value is less than or equal to a synchronization threshold, where a length of the test data block is n bits, the first k bits of the test data block are information bits, the last n–k bits of the test data block are the received parity bits, the reconstructed parity bits are obtained based on the information bits, a length of the reconstructed parity bits is n–k bits, and n and k are integers.

In a possible implementation, a position of the candidate bit is used as the synchronization position.

In a possible implementation, a plurality of observed bits is selected from the data sequence, and the candidate bit is selected from the plurality of observed bits.

In a possible implementation, that the candidate bit is selected from the plurality of observed bits includes determining a plurality of groups of first test data blocks in the data sequence based on the plurality of observed bits, where each of the plurality of groups of first test data blocks include at least one first test data block, and a position of each of the plurality of observed bits is a start position of each of the plurality of groups of first test data blocks; and selecting one observed bit from the plurality of observed bits as the candidate bit based on characteristic values of the plurality of groups of first test data blocks.

In a possible implementation, selecting one observed bit from the plurality of observed bits as the candidate bit based on characteristic values of the plurality of groups of first test data blocks includes sequentially determining whether a characteristic value of each of the plurality of groups of first test data blocks meets a candidate condition, until it is determined that a characteristic value of a group of first test data blocks meets the candidate condition; and using an observed bit corresponding to the group of first test data blocks that meet the candidate condition as the candidate bit.

In a possible implementation, the characteristic value of the group of first test data blocks is a total quantity of all-zero syndromes in syndromes of all first test data blocks in the group of first test data blocks, and the candidate condition is that the total quantity is greater than or equal to a synchronization threshold; or the characteristic value of the group of first test data blocks is a total quantity of non-all-zero syndromes in syndromes of all first test data blocks in the group of first test data blocks, and the candidate condition is that the total quantity is less than or equal to a synchronization threshold; or the characteristic value of the group of first test data blocks is a total quantity of zero elements in syndromes of all first test data blocks in the group of first test data blocks, and the candidate condition is that the total quantity is greater than or equal to a synchronization threshold; or the characteristic value of the group of first test data blocks is a total quantity of non-zero elements in syndromes of all first test data blocks in the group of first test data blocks, and the candidate condition is that the total quantity is less than or equal to a synchronization threshold; or the characteristic value of the group of first test data blocks is a total quantity of correctable test data blocks in all first test data blocks in the group of first test data blocks, and the candidate condition is that the total quantity is greater than or equal to a synchronization threshold; or the characteristic value of the group of first test data blocks is a total quantity of uncorrectable test data blocks in all first test data blocks in the group of first test data blocks, and the candidate condition is that the total quantity is less than or equal to a synchronization threshold; or the characteristic value of the group of first test data blocks is a total quantity of test data blocks whose reconstructed parity bits are the same as received parity bits in all first test data blocks in the group of first test data blocks, and the candidate condition is that the total quantity is greater than or equal to a synchronization threshold; or the characteristic value of the group of first test data blocks is a total quantity of test data blocks whose reconstructed parity bits are different from received parity bits in all first test data blocks in the group of first test data blocks, and the candidate condition is that the total quantity is less than or equal to a synchronization threshold; or the characteristic value of the group of first test data blocks is a cumulative quantity of all-zero syndromes in syndromes of the first X first test data blocks in the group of first test data blocks, and the candidate condition is that the cumulative quantity is greater than or equal to a synchronization threshold; or the characteristic value of the group of first test data blocks is a cumulative quantity of zero elements in syndromes of the first X first test data blocks in the group of first test data blocks, and the candidate condition is that the cumulative quantity is greater than or equal to a synchronization threshold; or the characteristic value of the group of first test data blocks is a cumulative quantity of correctable test data blocks in the first X first test data blocks in the group of first test data blocks, and the candidate condition is that the cumulative quantity is greater than or equal to a synchronization threshold; or the characteristic value of the group of first test data blocks is a cumulative quantity of test data blocks whose reconstructed parity bits are the same as received parity bits in the first X first test data blocks in the group of first test data blocks, and the candidate condition is that the cumulative quantity is greater than or equal to a synchronization threshold, where a length of the test data block is n bits, the first k bits of the test data block are information bits, the last n–k bits of the test data block are the received parity bits, the reconstructed parity bits are obtained based on the information bits, a length of the reconstructed parity bits is n–k bits, and n, k, and X are integers.

In a possible implementation, selecting one observed bit from the plurality of observed bits as the candidate bit based on characteristic values of the plurality of groups of first test data blocks includes comparing characteristic values of all of the plurality of groups of first test data blocks; and using an observed bit corresponding to a group of first test data blocks whose characteristic value is an extreme value as the candidate bit.

In a possible implementation, the characteristic value is a quantity of all-zero syndromes in syndromes, and the extreme value is a maximum value; or the characteristic value is a quantity of non-all-zero syndromes in syndromes, and the extreme value is a minimum value; or the characteristic value is a quantity of zero elements in a syndrome, and the extreme value is a maximum value; or the characteristic value is a quantity of non-zero elements in a syndrome, and the extreme value is a minimum value; or the characteristic value is a quantity of correctable test data blocks, and the extreme value is a maximum value; or the characteristic value is a quantity of uncorrectable test data blocks, and the extreme value is a minimum value; or the characteristic value is a quantity of test data blocks whose reconstructed parity bits are the same as received parity bits, and the extreme value is a maximum value; or the characteristic value is a quantity of test data blocks whose reconstructed parity bits are different from received parity bits, and the extreme value is a minimum value, where a length of the test data block is n bits, the first k bits of the test data block are information bits, the last n−k bits of the test data block are the received parity bits, the reconstructed parity bits are obtained based on the information bits, a length of the reconstructed parity bits is n−k bits, and n and k are integers.

In a possible implementation, that a plurality of observed bits are selected from the data sequence includes: selecting one bit from the data sequence at an interval of T bits, and using the bit as the observed bit, where T is an integer greater than 0; or selecting one bit from the data sequence at an interval of L×n+T bits, and using the bit as the observed bit, where L is a quantity of test data blocks in the interval, a length of the test data block is n bits, and L and T are integers greater than 0.

In a possible implementation, the data sequence is a modulated signal, the data sequence includes a plurality of modulated symbols, and that a plurality of observed bits is selected from the first data includes selecting a start bit of a modulated symbol from the data sequence at an interval of T modulated symbols, and using the start bit as the observed bit, where T is an integer greater than 0; or selecting a start bit of a modulated symbol from the data sequence at an interval of L×m+T modulated symbols, and using the start bit as the observed bit, where L is a quantity of test data blocks in the interval, a length of the test data block is m modulated symbols, and L and T are integers greater than 0.

In a possible implementation, a quantity of observed bits is P, P is a positive integer, and a length of the codeword is P bits.

In a possible implementation, determining a candidate bit in the data sequence in step 2 includes determining a candidate bit in a first subsequence; and that at least one second test data block is obtained from the data sequence through division based on the candidate bit in step 3 includes: obtaining at least one second test data block from a second subsequence through division based on the candidate bit, where the first subsequence and the second subsequence are included in the data sequence, and the second subsequence is the same as, partially the same as, or different from the first subsequence.

In a possible implementation, after step 3, the method further includes step 4: in response to that the data sequence is in an out-of-lock state, determining an updated synchronization position of the data sequence.

In a possible implementation, determining an updated synchronization position of the data sequence includes performing step 2 and step 3 again, and using a synchronization position determined in step 3 that is performed again as the updated synchronization position.

In a possible implementation, after step 3 and before step 4, the method further includes obtaining a plurality of synchronization codewords from the data sequence through division based on the synchronization position, where the synchronization position is a start position of the plurality of synchronization codewords; and performing verification on characteristic values of the plurality of synchronization codewords, and when the verification fails, determining that the data sequence is in the out-of-lock state.

In a possible implementation, performing verification on characteristic values of the plurality of synchronization codewords includes sequentially accumulating a characteristic value of each of the plurality of synchronization codewords to obtain a cumulative value, where when the cumulative value meets an out-of-lock condition, the verification fails.

In a possible implementation, the characteristic value is a quantity of non-all-zero syndromes in syndromes, and the out-of-lock condition is that the cumulative value is greater than or equal to a synchronization threshold; or the characteristic value is a quantity of non-zero elements in a syndrome, and the out-of-lock condition is that the cumulative value is greater than or equal to a synchronization threshold; or the characteristic value is a quantity of uncorrectable codewords, and the out-of-lock condition is that the cumulative value is greater than or equal to a synchronization threshold; or the characteristic value is a quantity of codewords whose reconstructed parity bits are different from received parity bits, and the out-of-lock condition is that the cumulative value is greater than or equal to a synchronization threshold, where a length of the codeword is n bits, the first k bits of the codeword are information bits, the last n−k bits of the codeword are the received parity bits, the reconstructed parity bits are obtained based on the information bits, a length of the reconstructed parity bits is n−k bits, and n and k are integers.

In a possible implementation, performing verification on characteristic values of the plurality of synchronization codewords includes adding up characteristic values of all of the plurality of synchronization codewords to obtain a total value, where when the total value meets an out-of-lock condition, the verification fails.

In a possible implementation, the characteristic value is a quantity of all-zero syndromes in syndromes, and the out-of-lock condition is that the total value is less than or equal to a synchronization threshold; or the characteristic value is a quantity of non-all-zero syndromes in syndromes, and the out-of-lock condition is that the total value is greater than or equal to a synchronization threshold; or the characteristic value is a quantity of zero elements in a syndrome, and the out-of-lock condition is that the total value is less than or equal to a synchronization threshold; or the characteristic value is a quantity of non-zero elements in a syndrome, and the out-of-lock condition is that the total value is greater than or equal to a synchronization threshold; or the characteristic value is a quantity of correctable codewords, and the out-of-lock condition is that the total value is less than or equal to a synchronization threshold; or the characteristic value is a quantity of uncorrectable codewords, and the out-of-lock condition is that the total value is greater than or equal to a synchronization threshold; or the characteristic value is a quantity of codewords whose reconstructed parity bits are the same as received parity bits, and the out-of-lock condition is that the total value is less than or equal to a synchronization threshold; or the characteristic value is a quantity of codewords whose reconstructed parity bits are different from received parity bits, and the out-of-lock condition is that the total value is greater than or equal to a synchronization threshold, where a length of the codeword is n bits, the first k bits of the codeword are information bits, the last n–k bits of the codeword are the received parity bits, the reconstructed parity bits are obtained based on the information bits, a length of the reconstructed parity bits is n–k bits, and n and k are integers.

In a possible implementation, the data sequence is a linear block code.

According to a second aspect, this application provides a communication device for performing the method in any one of the first aspect or the possible implementations of the first aspect. In an example, the network device includes units configured to perform the method in any one of the first aspect or the possible implementations of the first aspect.

According to a third aspect, this application provides a communication device, where the communication device includes a processor, a communication interface, and a memory. The communication interface may be a transceiver. The memory may be configured to store program code. The processor is configured to invoke the program code in the memory to perform the method in any one of the first aspect or the possible implementations of the first aspect. Details are not described herein again.

According to a fourth aspect, this application provides a network system. The network system includes a sending device and a receiving device. The receiving device is the communication device provided in the second or third aspect, and the receiving device is configured to receive a data sequence sent by the sending device.

According to a fifth aspect, this application provides a non-transitory computer-readable storage medium. The computer-readable storage medium stores instructions. When the instructions are run on a computer, the computer is enabled to perform the methods in the foregoing aspects.

According to a sixth aspect, this application provides a computer program product including computer program instructions. When the computer program product runs on a network device, the network device is enabled to perform the method provided in any one of the first aspect or the possible implementations of the first aspect.

According to a seventh aspect, this application provides a chip, including a memory and a processor. The memory is configured to store a computer program. The processor is configured to invoke the computer program from the memory and run the computer program, to perform the method in any one of the first aspect or the possible implementations of the first aspect.

Optionally, the chip includes a processor. The processor is configured to read a computer program stored in a memory and execute the computer program. When the computer program is executed, the processor performs the method in any one of the first aspect or the possible implementations of the first aspect.

According to an eighth aspect, this application provides a network node. The network node includes a main control board and an interface board. The main control board includes a first processor and a first memory. The interface board includes a second processor, a second memory, and an interface card. The main control board is coupled to the interface board.

The first memory may be configured to store program code. The first processor is configured to invoke the program code in the first memory to perform the following operations, such as, determining a candidate bit in a data sequence, where the candidate bit is included in a plurality of bits; and determining a synchronization position based on the candidate bit, where the synchronization position indicates a start position of a codeword in the data sequence.

The second memory may be configured to store program code. The second processor is configured to invoke the program code in the second memory to trigger the interface card to perform the following operation: receiving the data sequence, where the data sequence includes the plurality of bits.

In a possible implementation, an inter-process communication protocol (IPC) channel is established between the main control board and the interface board, and the main control board and the interface board communicate with each other through the IPC channel.

BRIEF DESCRIPTION OF DRAWINGS

To describe technical solutions of this application more clearly, the following describes the accompanying drawings for describing embodiments. It is clear that the accompanying drawings in the following descriptions show embodiments of this application, and a person of ordinary skill in the art can derive other technical solutions and accompanying drawings of this application from these accompanying drawings without creative efforts.

FIG. 3 is a synchronization flowchart according to an embodiment of this application;

FIG. 8A and FIG. 8B show a first stage of synchronization lock determining according to an embodiment of this application;

DESCRIPTION OF EMBODIMENTS

The following describes embodiments of this application with reference to the accompanying drawings.

Due to impact of channel loss and noise, an error occurs when a signal is transmitted in a channel, affecting reliability of a communication system. When the signal is represented in a form of a data sequence including a plurality of bits, the transmission error is embodied as a change in values of some bits in the data sequence, that is, a bit error occurs. FEC is a technology for controlling transmission errors in a communication system. In the FEC technology, redundant information is sent together with an original data sequence to recover errors during transmission and reduce a bit error rate. The FEC may be classified into a block code and a convolutional code based on different processing manners for information sequences. The block code may be further sub-classified into a linear block code and a non-linear block code. A systematic code of the linear block code is used as an example. A transmit end divides an original data sequence into groups, and a length of each group is k bits. Further, redundant information of n−k bits is added to each group according to a specific encoding rule, where the redundant information is also referred to as parity bits, to finally obtain a codeword with a length of n bits. Therefore, in the codeword with a length of n bits, the first k bits are original data and are also referred to as information bits, and the last n−k bits are the parity bits, and the entire codeword includes the information bits and the parity bits. After the codeword reaches a receive end through a channel, if a quantity of bit errors in the codeword is within a correctable range, the receive end may check for and correct an error in a decoding process, and restore the received codeword to the original data sent by the transmit end, thereby resisting interference from the channel and improving reliability of the communication system. Error detection and error correction functions of the linear block code need to be implemented based on a complete codeword. Therefore, before a data sequence received by the receive end is decoded, a codeword boundary needs to be determined in the data sequence. In an example, a start position and an end position of a complete codeword need to be found. This process is referred to as codeword synchronization or frame synchronization. If the codeword synchronization is performed incorrectly, In an example, a real codeword boundary is not determined, an expected effect of error detection or error correction cannot be achieved in a subsequent decoding process, or a quantity of bit errors may even increase, causing deterioration of performance of the communication system.

Figure 1:
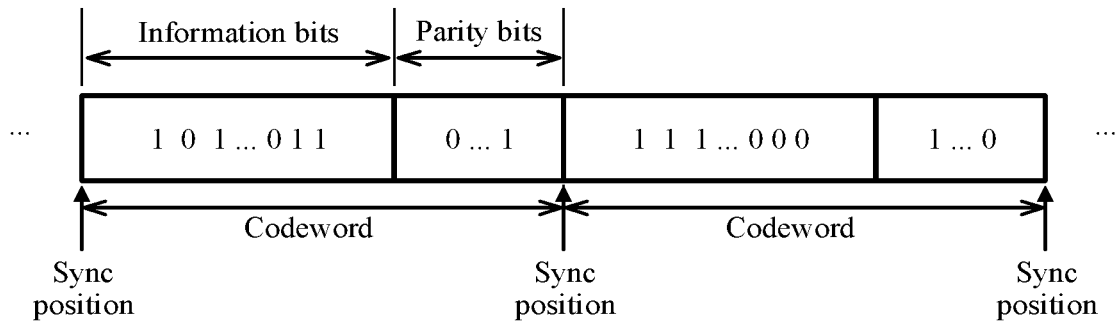
FIG. 1 shows synchronization positions of codewords according to an embodiment of this application.

A start position of each codeword may also be referred to as a synchronization position. A systematic code is still used as an example. FIG. 1 shows synchronization positions of codewords. As shown in FIG. 1, a length of an entire codeword is n bits, where the first k bits are original data (information bits), and the last n−k bits are additional parity bits added according to an encoding rule, and a synchronization position is a start position of the codeword, namely, a position of the first bit in the codeword. Both n and k are integers. It can be learned that there is a plurality of synchronization positions in a data sequence, and the plurality of synchronization positions are correlated with each other, where an interval between synchronization positions is fixed, and the interval is a length of a codeword.

In this embodiment of this application, although the systematic code is used as an example for description, this application is not limited to the systematic code, and is also applicable to a non-systematic code. This application is applicable to all communication systems using the linear block code. The linear block code includes but is not limited to a Reed-Solomon (RS) code, a Bose-Chaudhuri-Hocquenghem (BCH) code, a low-density parity-check (LDPC) code, a Hamming code, a Golay code, a Reed-Muller code, and the like.

Embodiments of this application provide a codeword synchronization method, and a device and system based on the method. The method, the device, and the system are based on a same concept. The method may include two stages. In a first stage, a plurality of groups of first test data blocks is obtained through division based on a plurality of observed bits, and an observed bit most likely in a synchronization position is selected from the plurality of observed bits based on the plurality of groups of first test data blocks. In a second stage, a group of second test data blocks are obtained through division based on the observed bit most likely in a synchronization position, and whether the observed bit most likely in a synchronization position is a synchronization position is determined based on the group of second test data blocks. Alternatively, the method may include only the first stage. After the observed bit most likely in a synchronization position is determined and selected, the observed bit most likely in a synchronization position is directly used as a synchronization position. In this method, a technical effect of high-precision codeword synchronization for a data stream at a receive end can be achieved without inserting additional data into a data stream at a transmit end, and synchronization performance achieves high reliability.

Figure 2:
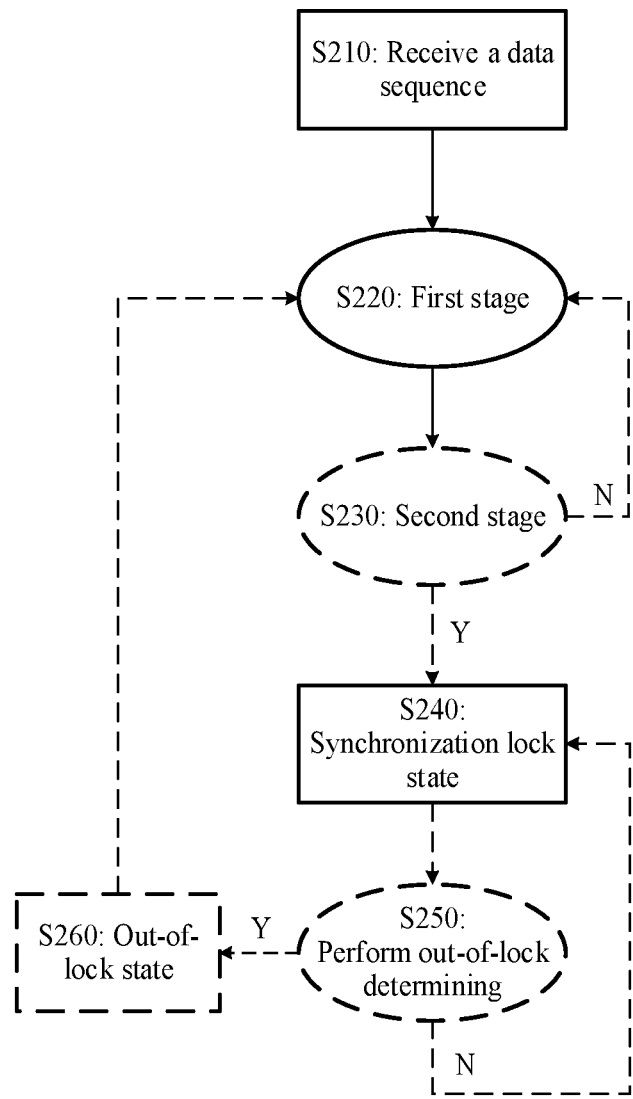
FIG. 2 is a synchronization flowchart according to an embodiment of this application.

FIG. 2 is a flowchart of a method according to an embodiment of this application. The method is applied to a receive-end device on a communication network. The receive-end device may be various devices for performing FEC, including but not limited to a router, a switch, and a server. The method includes the following steps.

S210: Receive a data sequence.

In an example, a receive end receives the data sequence from a transmit end, where the data sequence includes a plurality of bits, and each bit is binary data. That is, the data sequence is a sequence including a plurality of bits, and may also be referred to as a bit sequence. In some embodiments, the data sequence is a linear block code. The data sequence is transmitted through a channel, and a bit error may occur. Operations such as error detection and error correction need to be performed.

S220: In a first stage, determine a candidate bit in the data sequence, where the candidate bit is included in the plurality of bits. The candidate bit is an observed bit most likely in a synchronization position among a plurality of observed bits, in other words, a position of the candidate bit is a most likely synchronization position.

As shown in FIG. 3, the first stage may include two steps: step S221 and step S222.

S221: The receive end selects a plurality of observed bits from the received data sequence. Positions of the observed bits include the synchronization position, in an example, a position of one of the observed bits may be the synchronization position, in other words, the positions of the observed bits can cover the synchronization position.

Optionally, in the first stage, when the candidate bit in the data sequence is determined in the method, only a part of the data sequence, for example, a first subsequence in the data sequence, is used, that is, a candidate bit in the first subsequence is determined. The first subsequence includes a plurality of bits, and the first subsequence may be any part of the data sequence. The receive end selects the plurality of observed bits from the first subsequence, where the positions of the observed bits may be synchronization positions. For example, a quantity of observed bits is P, and P is an integer greater than 1.

Optionally, when the plurality of observed bits is selected from the received data sequence, intervals between every two adjacent observed bits in the plurality of observed bits are the same, and a position of each of the plurality of observed bits is sequentially arranged backward.

A concept of a test data block is introduced in a codeword synchronization process. The test data block is a part of the data sequence. The test data block includes several consecutive bits. A length of the test data block is the same as a length of a codeword. It can be said that the test data block is used to simulate a codeword.

Figure 4:
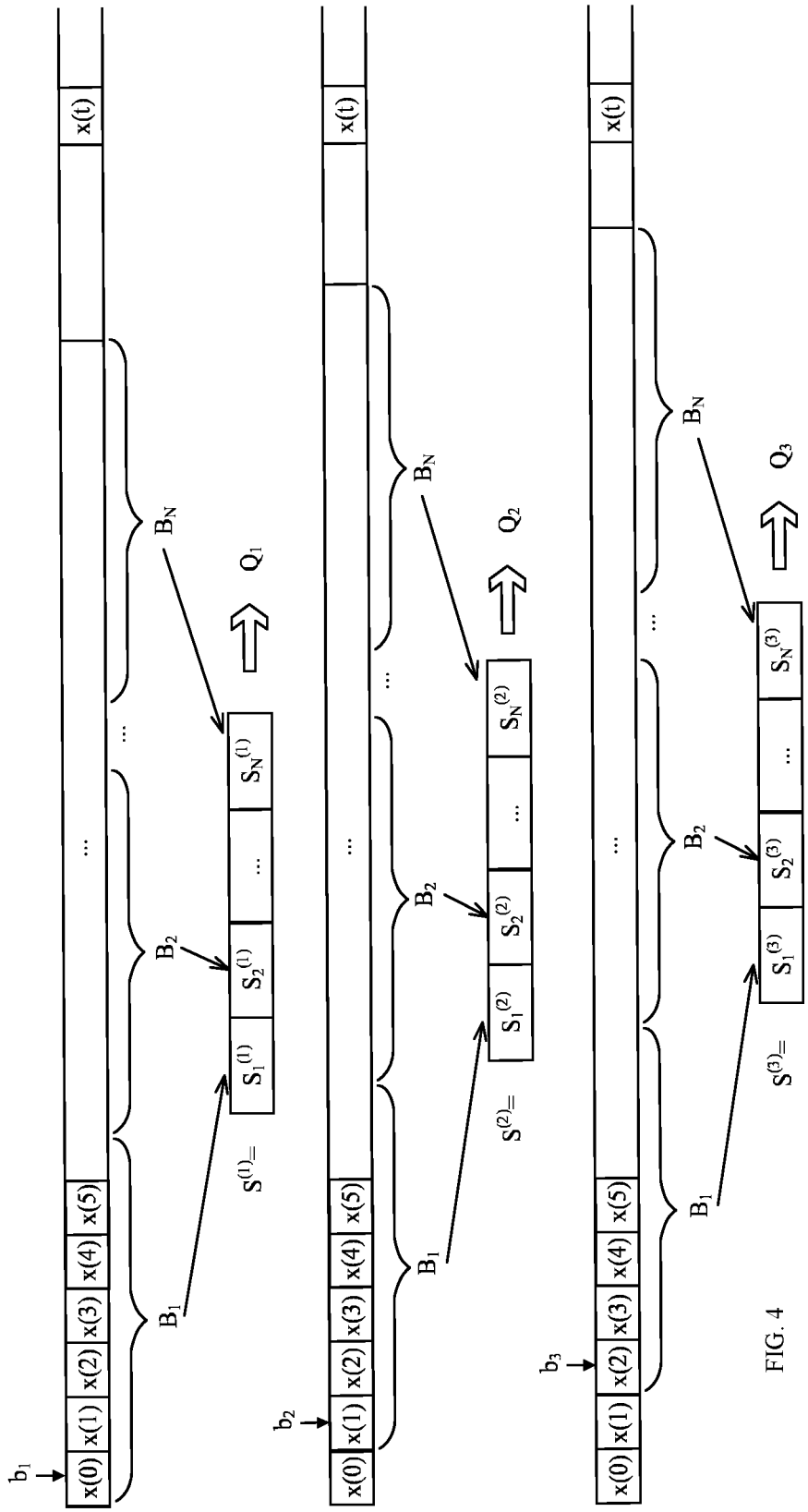
FIG. 4 shows an observed bit selection method according to an embodiment of this application.

Optionally, the plurality of observed bits may be located in a single test data block, and a position of each of the plurality of observed bits in the single test data block is sequentially arranged backward. In an example, one bit is selected as the observed bit at an interval of T bits, where T is an integer greater than 0. FIG. 4 shows an observed bit selection manner, where $b_1$, $b_2$, and $b_3$ are three adjacent observed bits and respectively correspond to three bits in the data sequence: $x(0)$, $x(1)$, and $x(2)$. An interval between observed bits is 1 bit, that is, T is 1. The three observed bits are located in a single test data block, for example, a test data block obtained through division by using $x(0)$ as a start position in FIG. 4. In the test data block, a position of $b_1$ is the first position in the test data block, and positions of $b_2$ and $b_3$ are the second position and the third position in the test data block respectively. That is, a position of each of the three observed bits in the single test data block is sequentially arranged backward. Although FIG. 4 shows only the three observed bits, a manner of selecting more observed bits may be deduced by analogy. Details are not described herein again.

Figure 5:
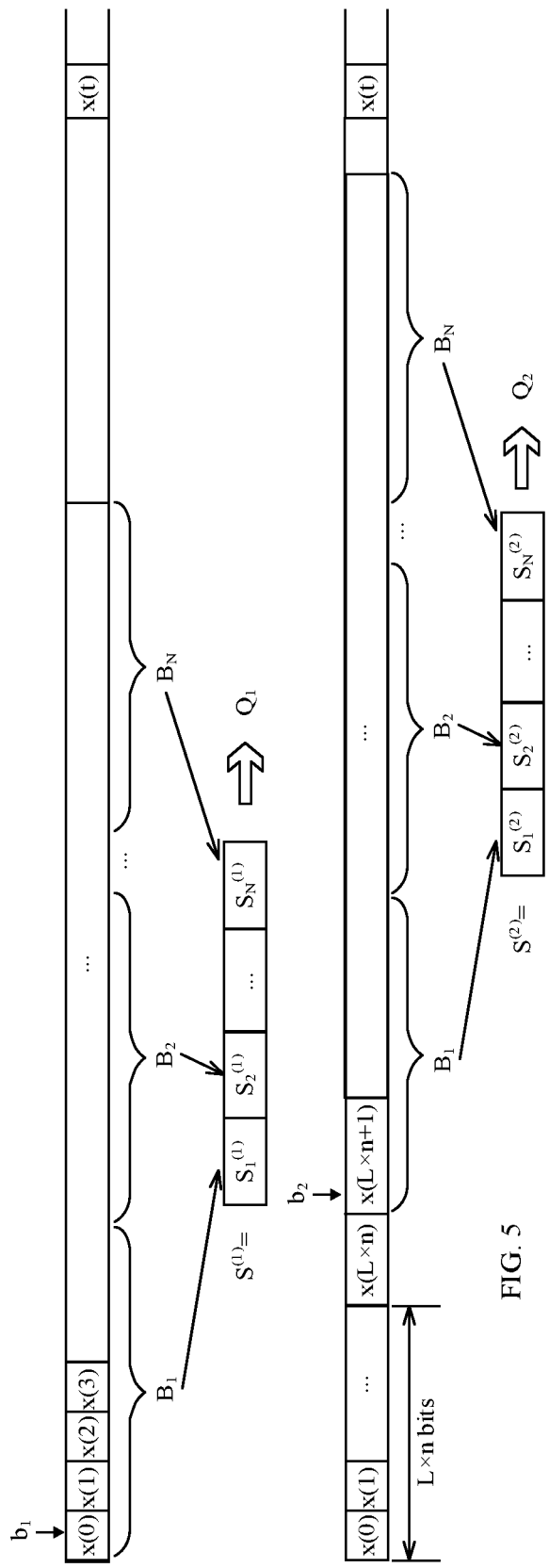
FIG. 5 shows an observed bit selection method according to an embodiment of this application.

Optionally, the plurality of observed bits may be respectively located in a plurality of test data blocks, and a position of each of the plurality of observed bits in each test data block is sequentially arranged backward. In an example, one bit is selected as the observed bit at an interval of L×n+T bits, where L is a quantity of test data blocks in the interval, a length of the test data block is n bits, and L and T are integers greater than 0. FIG. 5 shows an observed bit selection manner, where $b_1$ and $b_2$ are two adjacent observed bits and respectively correspond to two bits in the data sequence: $x(0)$ and $x(L×n+1)$. The two observed bits are respectively located in two different test data blocks, for example, a test data block obtained through division by using $x(0)$ as a start position and a test data block obtained through division by using $x(L×n)$ as a start position in FIG. 5. An interval between the two test data blocks is L test data blocks, and an interval between the two observed bits is L×n+1 bits, that is, T is 1. In the test data block obtained through division by using $x(0)$ as the start position, a position of $b_1$ is the first position in the test data block. In the test data block obtained through division by using $x(L×n)$ as the start position, a position of $b_2$ is the second position in the test data block. In an example, a position of each of the two observed bits in each test data block is sequentially arranged backward. Although FIG. 5 shows only the two observed bits, a manner of selecting more observed bits may be deduced by analogy. Details are not described herein again. In this case, an interval between adjacent observed bits is longer, and correlation between observed bits is lower, thereby reducing impact caused by a burst bit error, and improving accuracy of codeword synchronization.

Optionally, when the plurality of observed bits is selected, the positions of the plurality of observed bits may traverse all positions in a test data block.

For example, when the plurality of observed bits is located in a single test data block, the positions of the plurality of observed bits may traverse all positions in the test data block, in other words, the positions of the plurality of observed bits traverse all positions in the codeword. In the observed bit selection manner shown in FIG. 4, a length of a codeword is n bits, and a quantity of observed bits is P. When P is equal to n, the positions of the plurality of observed bits can traverse all positions in the single test data block.

For example, when the plurality of observed bits is respectively located in a plurality of test data blocks, a same position in each of the plurality of test data blocks is considered as an equivalent position. For example, the first position in each of the plurality of test data blocks is considered as an equivalent position. In this way, the positions of the plurality of observed bits can traverse all equivalent positions, in other words, the positions of the plurality of observed bits traverse all positions in the plurality of test data blocks. In the observed bit selection manner shown in FIG. 5, a length of a codeword is n bits, where in this case, a quantity of equivalent positions is n, and a quantity of observed bits is P. When P is equal to n, the positions of the plurality of observed bits can traverse all equivalent positions, in other words, the positions of the plurality of observed bits can traverse all positions in the plurality of test data blocks.

Optionally, when the plurality of observed bits is selected, the positions of the plurality of observed bits may alternatively not traverse all positions in a codeword. That is, a value of P may be less than n.

If the positions of the plurality of observed bits traverse all the positions in the test data block, accuracy of a codeword synchronization result is higher. However, as a quantity of observed bits increases, system resources consumed in a codeword synchronization process also increase.

A signal may be modulated at the transmit end to obtain a modulated signal. Common modulation schemes include pulse amplitude modulation (PAM), quadrature amplitude modulation (QAM), phase-shift keying (PSK), and the like. A pulse amplitude of the modulated signal may include a plurality of orders, and a quantity of the plurality of orders may be referred to as a modulation order. The PAM is used as an example. When the pulse amplitude of the modulated signal has two orders, the modulation order is 2, and a modulation scheme may be referred to as PAM2; when the pulse amplitude of the modulated signal has four orders, the modulation order is 4, and a modulation scheme may be referred to as PAM4; and so on. The modulated signal may be represented as a modulated data sequence. Compared with an unmodulated data sequence, a basic unit of the modulated data sequence changes from a bit to a symbol. In an example, in the modulated data sequence, a codeword includes several symbols, and a symbol includes several bits. A quantity of bits included in the symbol is related to the modulation order. When the modulation order is M, the quantity of bits included in the symbol is $\log_2 M$, where M is an integer multiple of 2. For example, when the modulation order is 2, the symbol includes one bit; or when the modulation order is 4, the symbol includes two bits. It can be learned that a start position of the codeword is also certainly a start position of a specific symbol, but not another position of the symbol. Therefore, for the modulated signal, when the plurality of observed bits is selected, only a start bit of a symbol may be considered, without considering other bits of the symbol.

Figure 6:
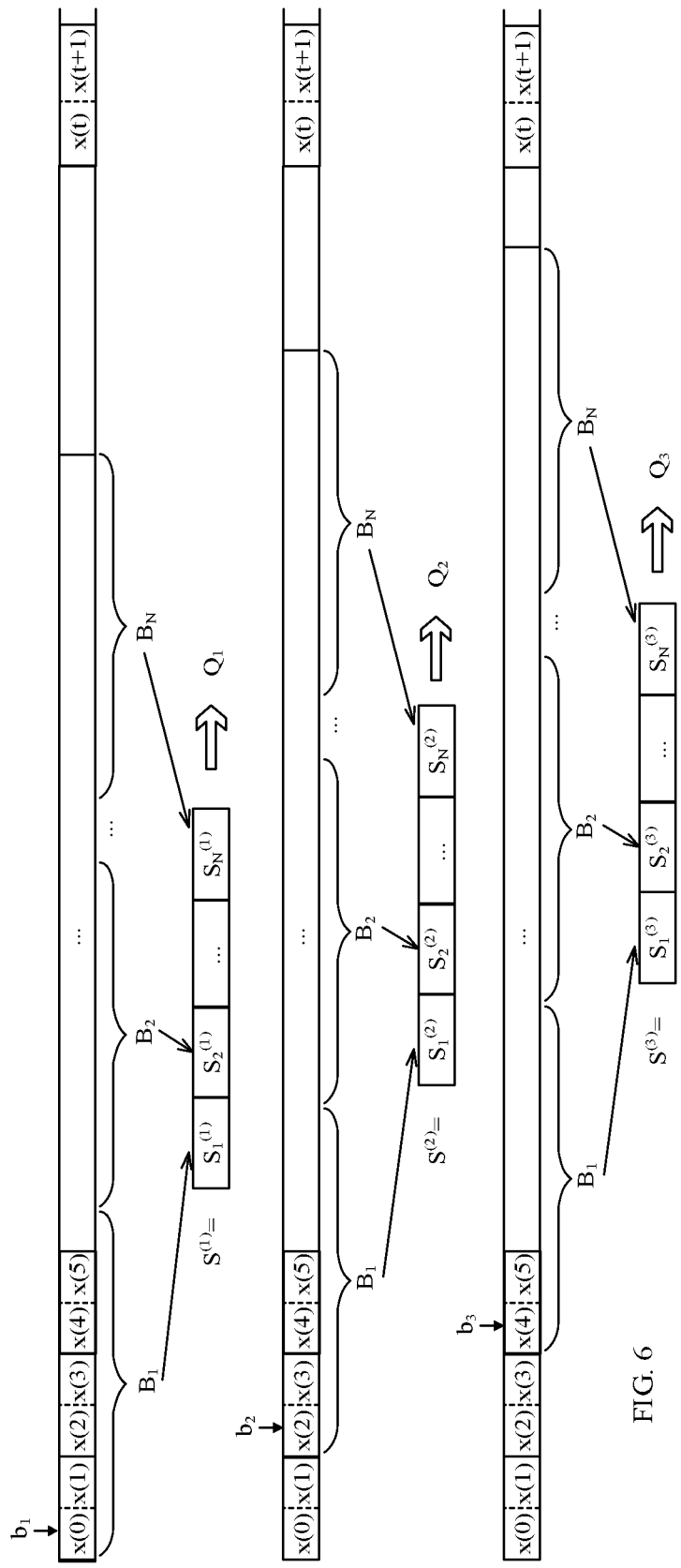
FIG. 6 shows an observed bit selection method according to an embodiment of this application.

Optionally, the plurality of observed bits is respectively start bits of a plurality of symbols, the plurality of symbols is in a single test data block, and positions of the plurality of symbols in the test data block are sequentially arranged backward. In an example, a start bit of a modulated symbol is selected as the observed bit at an interval of T modulated symbols, where T is an integer greater than 0. In other words, a start bit of a modulated symbol is selected as the observed bit at an interval of T·$\log_2$ M bits. FIG. 6 shows an observed bit selection manner, where a data sequence is a modulated signal, and a modulation order is 4. In this case, the data sequence includes a plurality of modulated symbols, and each symbol includes two bits, for example, a symbol including x(0) and x(1), a symbol including x(2) and x(3), a symbol including x(4) and x(5), and so on. $b_1$, $b_2$, and $b_3$ are three adjacent observed bits and respectively correspond to three bits in the data sequence: x(0), x(2), and x(4). The three observed bits are respectively start bits of three symbols, and the three symbols are the symbol including x(0) and x(1), the symbol including x(2) and x(3), and the symbol including x(4) and x(5). An interval between every two adjacent symbols in the three symbols is one symbol, that is, T is 1. In addition, positions of the three symbols in a single test data block are sequentially arranged backward. Although FIG. 6 shows only the three observed bits, a manner of selecting more observed bits may be deduced by analogy. Details are not described herein again.

Figure 7:
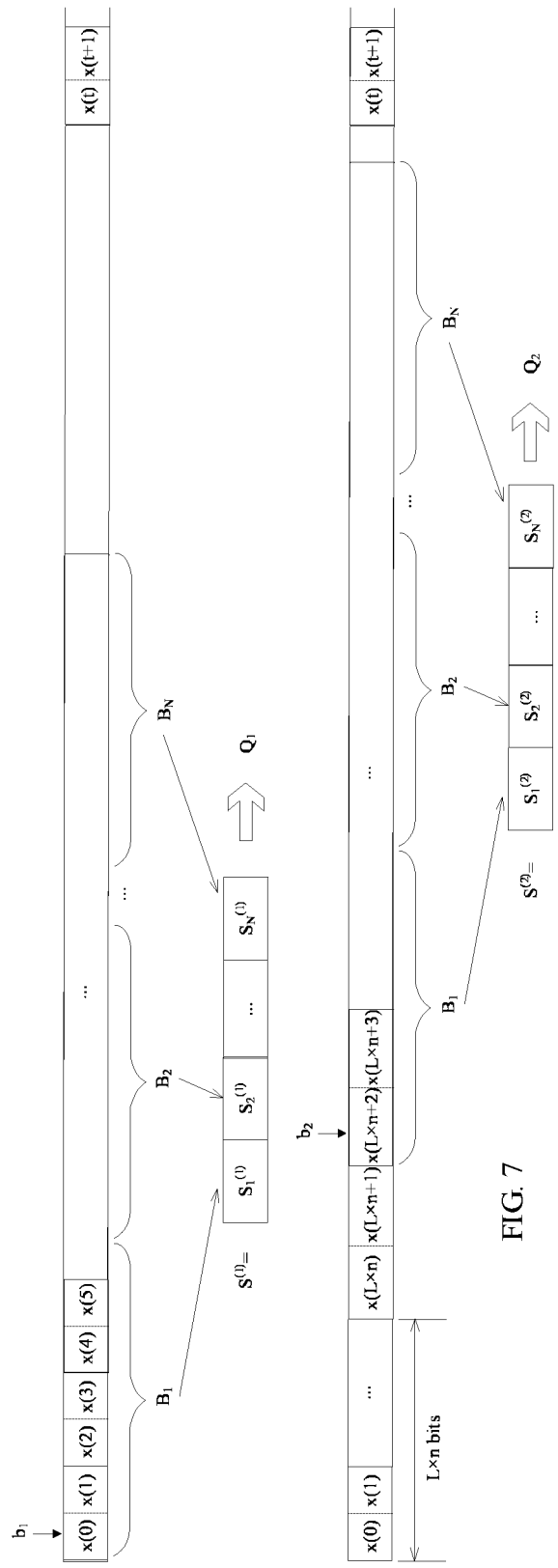
FIG. 7 shows an observed bit selection method according to an embodiment of this application.

Optionally, the plurality of observed bits is respectively start bits of a plurality of symbols, the plurality of symbols is respectively located in a plurality of test data blocks, and a position of each of the plurality of symbols in each test data block is sequentially arranged backward. In an example, a start bit of a modulated symbol is selected as the observed bit at an interval of L×m+T modulated symbols, where L is a quantity of test data blocks in the interval, a length of the test data block is m modulated symbols, and L and T are integers greater than 0. In other words, a start bit of a modulated symbol is selected as the observed bit at an interval of (L m+T) $\log_2$ M bits. FIG. 7 shows an observed bit selection manner, where a data sequence is a modulated signal, and a modulation order is 4. In this case, the data sequence includes a plurality of modulated symbols, and each symbol includes two bits, for example, a symbol including x(0) and x(1), a symbol including x(L×n) and x(L×n+1), a symbol including x(L×n+2) and x(L×n+3), and so on. $b_1$ and $b_2$ are two adjacent observed bits and respectively correspond to two bits in the data sequence: x(0) and x(L×n+2). The two observed bits are respectively start bits of two symbols, and the two symbols are the symbol including x(0) and x(1), and the symbol including x(L×n+2) and x(L×n+3). In addition, the two observed bits are respectively located in two different test data blocks, for example, a test data block obtained through division by using x(0) as a start position and a test data block obtained through division by using x(L×n) as a start position in FIG. 7. An interval between the two test data blocks is L test data blocks, and an interval between the two observed bits is L×m+1 symbols, that is, T is 1. In the test data block obtained through division by using x(0) as the start position, a symbol in which $b_1$ is located is the first symbol in the test data block. In the test data block obtained through division by using x(L×n) as the start position, a symbol in which $b_2$ is located is the second symbol in the test data block. That is, a position of each of the two symbols in each test data block is sequentially arranged backward. Although FIG. 7 shows only the two observed bits, a manner of selecting more observed bits may be deduced by analogy. Details are not described herein again. In this case, an interval between adjacent observed bits is longer, and correlation between observed bits is lower, thereby reducing impact caused by a burst bit error, and improving accuracy of codeword synchronization.

S222: Select a candidate bit from the plurality of observed bits. The candidate bit is one of the plurality of observed bits, and the candidate bit is an observed bit most likely in a synchronization position. In an example, S222 may include two steps: step S2221 and step S2222.

S2221: Obtain a plurality of groups of first test data blocks from the data sequence through division based on the plurality of observed bits, where the plurality of groups of first test data blocks are in a one-to-one correspondence with the plurality of observed bits. In an example, each of the plurality of groups of first test data blocks include at least one first test data block, and a position of each of the plurality of observed bits is a start position of each of the plurality of groups of first test data blocks.

Optionally, each of the plurality of observed bits is used as a start position, and N test data blocks after the observed bit are selected, where N is an integer greater than or equal to 1. A position of each of the plurality of observed bits is a start position of each of the plurality of groups of first test data blocks. N test data blocks selected by using each observed bit as a start position are a group of first test data blocks. In this case, a plurality of groups of N test data blocks selected by using each of the plurality of observed bits as a start position are the plurality of groups of first test data blocks. Each of the plurality of groups of first test data blocks correspond to one observed bit used as a start position of the group of first test data blocks, that is, the plurality of groups of first test data blocks are in a one-to-one correspondence with the plurality of observed bits.

Optionally, the N test data blocks may be consecutive, that is, each group of first test data blocks include N consecutive data blocks. When a length of each test data block is n bits, N×n consecutive bits after the observed bit are selected, to obtain the N test data blocks.

Optionally, the N test data blocks may be alternatively inconsecutive, and a start position of each of the N test data blocks is correlated with an observed bit corresponding to the group of test data blocks. In an example, an interval between the start position of each test data block and the observed bit corresponding to the group of test data blocks is an integer multiple of a length of a codeword, that is, intervals between every two of the N test data blocks are integer multiples of the length of the codeword. In addition, the intervals between every two of the N test data blocks may be the same or different.

As shown in FIG. 4, the observed bit $b_1$ is used as a start position, and a group of first test data blocks after the observed bit $b_1$ are selected. The group of first test data blocks include N test data blocks: $B_1$, $B_2$, . . . , and $B_N$, and a length of each test data block is n bits. Similarly, if the observed bit $b_2$ or $b_3$ is used as a start position, a group of first test data blocks after the observed bit $b_2$ or $b_3$ can also be selected. If the observed bit $b_1$, $b_2$, or $b_3$ is separately used as a start position, the plurality of groups of first test data blocks are selected. Manners of selecting the plurality of groups of first test data blocks in FIG. 5, FIG. 6, and FIG. 7 are similar to that in FIG. 4. Details are not described herein again.

S2222: Select one observed bit, namely, the observed bit most likely in a synchronization position, from the plurality of observed bits as the candidate bit based on characteristic values of the plurality of groups of first test data blocks.

Optionally, when one observed bit is selected, based on the characteristic values of the plurality of groups of first test data blocks, from the plurality of observed bits as the observed bit most likely in a synchronization position, a selection manner may be a selection manner of early termination. In an example, whether a characteristic value of each of the plurality of groups of first test data blocks meets a candidate condition is sequentially determined, until it is determined that a characteristic value of a group of first test data blocks meets the candidate condition; and an observed bit corresponding to the group of first test data blocks that meet the candidate condition is used as the candidate bit.

Optionally, when one observed bit is selected, based on the characteristic values of the plurality of groups of first test data blocks, from the plurality of observed bits as the observed bit most likely in a synchronization position, a selection manner may be a selection manner of traversal. In an example, characteristic values of all of the plurality of groups of first test data blocks are compared, and an observed bit corresponding to a group of first test data blocks whose characteristic value is an extreme value is used as the candidate bit.

In the selection manner of early termination and the selection manner of traversal, characteristic values may be calculated in parallel. In an example, a plurality of calculation units is used to simultaneously calculate characteristic values of a plurality of test data blocks. For example, 10 calculation units are used to simultaneously calculate characteristic values of 10 test data blocks. In the parallel calculation manner, a calculation time can be shortened, and a latency can be reduced.

Optionally, the characteristic value may be a characteristic value of a syndrome.

A parity-check matrix may be generated for each linear block code. The parity-check matrix describes a linear relationship between data within codewords of the linear block code, and the parity-check matrix may be applied to a decoding process. When the data sequence is a linear block code, a parity-check matrix also exists for the data sequence, and may be referred to as a parity-check matrix of the data sequence. In an example, the data sequence and the parity-check matrix of the data sequence meet the following expression:

$$S = C \cdot H^T = \vec{0} \quad (1),$$

where C is a codeword in the data sequence, S is a syndrome of the codeword, and H is the parity-check matrix of the data sequence. It can be learned from the expression (1) that the syndrome of the codeword in the data sequence is obtained by multiplying the codeword by a transposed matrix of the parity-check matrix of the data sequence, and the syndrome is a zero vector, namely, an all-zero matrix.

As described above, when the data sequence is a data sequence received by the receive end, a start position of a codeword needs to be determined in the data sequence. If a codeword is not obtained from the data sequence through division in a correct start position, an obtained codeword no longer meets the expression (1). In this case, a syndrome of a codeword in the data sequence may be represented by using the following expression:

$$S_R = R \cdot H^T \quad (2),$$

where R is a codeword in the data sequence received by the receive end, $S_R$ is a syndrome of the codeword, and H is a parity-check matrix of an original data sequence sent by the transmit end. In the expression (2), the syndrome of the codeword in the data sequence received by the receive end is a product of the codeword and a transposed matrix of a parity-check matrix of the original data sequence sent by the transmit end. It can be learned from the foregoing analysis that, for a received codeword, when no bit error occurs in the codeword, $S_R$ is an all-zero matrix; or when a bit error occurs in the codeword, $S_R$ is very likely no longer an all-zero matrix. Therefore, codeword synchronization may be implemented by using a syndrome of a test data block in the data sequence received by the receive end. In an example, one observed bit may be selected, by using the syndrome of the test data block in the data sequence received by the receive end, from the plurality of observed bits as the observed bit most likely in a synchronization position.

Optionally, a syndrome of each of the plurality of groups of first test data blocks is separately calculated.

As shown in FIG. 4, a syndrome of a group of first test data blocks with the observed bit $b_1$ as a start bit is calculated: $S^{(1)}$ shown in FIG. 4, including $S_1^{(1)}$, $S_2^{(1)}$, ..., and $S_N^{(1)}$, corresponding to test data blocks $B_1, B_2, \ldots,$ and $B_N$ respectively. By analogy, a syndrome of a group of first test data blocks with the observed bit $b_2$ as a start bit and a syndrome of a group of first test data blocks with the observed bit $b_3$ as a start bit are separately calculated: $S^{(2)}$ and $S^{(3)}$ shown in FIG. 4. Although FIG. 4 shows only a manner of calculating a syndrome of a group of first test data blocks with each of three observed bit as a start bit, a manner of calculating more syndromes may be obtained by analogy. Details are not described herein again. Manners of calculating syndromes of the plurality of groups of first test data blocks in FIG. 5, FIG. 6, and FIG. 7 are similar to that in FIG. 4. Details are not described herein again.

For example, the characteristic value may be a quantity of all-zero syndromes in syndromes. When the selection manner of early termination is used, the candidate condition is correlated with the characteristic value. The candidate condition may be that a characteristic value of a group of first test data blocks is greater than or equal to a synchronization threshold. In an example, a relationship between the synchronization threshold and a quantity of all-zero syndromes in syndromes of each group of first test data blocks is sequentially determined, and when it is determined that a quantity of all-zero syndromes in syndromes of a group of first test data blocks is greater than or equal to the synchronization threshold, an observed bit corresponding to the group of first test data blocks that meet the candidate condition is used as the candidate bit. The observed bit corresponding to the group of first test data blocks is an observed bit used as a start bit of the group of first test data blocks.

A value of the synchronization threshold may be obtained through simulation analysis. For example, a data sequence is used as a data sequence received by the receive end, a bit error rate of the data sequence is designed to be within an acceptable range, a quantity of all-zero syndromes in syndromes of a group of test data blocks obtained through division based on a synchronization position and a quantity of all-zero syndromes in syndromes of a group of test data blocks obtained through division based on a non-synchronization position are separately counted, and a synchronization threshold is determined based on a difference between the two quantities, so that the synchronization threshold can be used to distinguish between the synchronization position and the non-synchronization position.

When the characteristic value is a quantity of all-zero syndromes in syndromes and the selection manner of early termination is used, for a process of selecting the observed bit most likely in a synchronization position, refer to FIG. 4. The synchronization threshold may be 2. As shown in FIG. 4, a relationship between the synchronization threshold and a quantity of all-zero syndromes in each of the syndromes $S^{(1)}$, $S^{(2)}$, and $S^{(3)}$ is sequentially determined. For example, a quantity $Q_1$ of all-zero syndromes in syndromes of a first group of first test data blocks is equal to 0, which is less than the synchronization threshold. A quantity $Q_2$ of all-zero syndromes in syndromes of a second group of first test data blocks is equal to 2, which is equal to the synchronization threshold. In this case, $b_2$ is selected as the observed bit most likely in a synchronization position. In addition, when determining proceeds to $b_2$, if it is determined that $b_2$ meets the candidate condition, a relationship between the synchronization threshold and a quantity of all-zero syndromes in syndromes corresponding to a subsequent observed bit is no longer determined, that is, a relationship between the synchronization threshold and a quantity of all-zero syndromes in $S^{(3)}$ is no longer determined.

Optionally, in the selection manner of early termination, a statistical manner of early termination may be alternatively used for a characteristic value of each group of first test data blocks. In an example, the characteristic value of the group of first test data blocks may be a total quantity of all-zero syndromes in syndromes of all first test data blocks in the group of first test data blocks, and correspondingly, the candidate condition may be that the total quantity is greater than or equal to the synchronization threshold. In the selection process shown in FIG. 4, when a relationship between the synchronization threshold and a quantity of all-zero syndromes in each of the syndromes $S^{(1)}$, $S^{(2)}$, and $S^{(3)}$ is sequentially determined, a syndrome of each test data block in each group of first test data blocks is sequentially calculated; when the syndrome is an all-zero syndrome, a quantity of all-zero syndrome is incremented by 1; and when a cumulative quantity of all-zero syndromes meets the candidate condition, in other words, the cumulative quantity of all-zero syndromes is greater than or equal to the synchronization threshold, it is considered that the group of first test data blocks already meet the candidate condition, and calculation is no longer performed for a subsequent test data block that is in the group and whose syndrome has not been calculated. For example, for the second group of first test data blocks, if both $S_1^{(2)}$ and $S_2^{(2)}$ are all-zero syndromes, it is considered that the quantity $Q_2$ of all-zero syndromes in the syndromes of the second group of first test data blocks has been accumulated to 2, which reaches the synchronization threshold, and the group of first test data blocks already meet the candidate condition. In this case, $b_2$ is selected as the observed bit most likely in a synchronization position, and syndromes of subsequent $S_3^{(2)}$ to $S_N^{(2)}$ are no longer calculated. Optionally, in the selection manner of early termination, a statistical manner of traversal may be alternatively used for a characteristic value of each group of first test data blocks. In an example, the characteristic value of the group of first test data blocks may be a cumulative quantity of all-zero syndromes in syndromes of the first X first test data blocks in the group of first test data blocks, and correspondingly, the candidate condition may be that the cumulative quantity is greater than or equal to the synchronization threshold. In a specific selection process, a syndrome of each first test data block in the group is calculated, to determine whether a total quantity of all-zero syndromes in the group of syndromes meets the candidate condition, in other words, whether the total quantity of all-zero syndromes in the group of syndromes is greater than or equal to the synchronization threshold. A specific operation process is not described herein again.

For example, the characteristic value may be a quantity of all-zero syndromes in syndromes. When the selection manner of traversal is used, the extreme value is correlated with the characteristic value. The extreme value may be a maximum value. In an example, a quantity of all-zero syndromes in syndromes of each group of first test data blocks may be counted, a group of first test data blocks with a largest quantity of all-zero syndromes are determined, and an observed bit corresponding to the group of first test data blocks is used as the observed bit most likely in a synchronization position.

When the characteristic value is a quantity of all-zero syndromes in syndromes and the selection manner of traversal is used, for a process of selecting the observed bit most likely in a synchronization position, still refer to FIG. 4. As shown in FIG. 4, a quantity of all-zero syndromes in each of the syndromes $S^{(1)}$, $S^{(2)}$, and $S^{(3)}$ is separately counted, and is denoted as $Q_1$, $Q_2$, and $Q_3$ respectively, and a maximum value of the quantities is determined, for example, $Q_1=0$, $Q_2=0$, and $Q_3=2$, and a maximum value is as follows: $Q_3=2$. In this case, $b_3$ is selected as the observed bit most likely in a synchronization position, and a position of $b_3$ is a most likely synchronization position.

For example, the characteristic value may be a quantity of non-all-zero syndromes in syndromes. When the selection manner of early termination is used, the candidate condition is correlated with the characteristic value. The candidate condition may be that a characteristic value of a group of first test data blocks is less than or equal to a synchronization threshold. In an example, a relationship between the synchronization threshold and a quantity of non-all-zero syndromes in syndromes of each group of first test data blocks is sequentially determined, and when it is determined that a quantity of non-all-zero syndromes in syndromes of a group of first test data blocks is less than or equal to the synchronization threshold, an observed bit corresponding to the group of first test data blocks that meet the candidate condition is used as the candidate bit. A value of the synchronization threshold may be alternatively obtained through simulation analysis. A specific process is similar to that of the synchronization threshold corresponding to all-zero syndromes. Details are not described herein again.

For example, the characteristic value may be a quantity of non-all-zero syndromes in syndromes. When the selection manner of traversal is used, the extreme value is correlated with the characteristic value. The extreme value may be a minimum value. In an example, a quantity of non-all-zero syndromes in syndromes of each group of first test data blocks may be counted, a group of first test data blocks with a smallest quantity of non-all-zero syndromes are determined, and an observed bit corresponding to the group of first test data blocks is used as the observed bit most likely in a synchronization position.

For example, the characteristic value may be a quantity of zero elements in a syndrome. When the selection manner of early termination is used, the candidate condition is correlated with the characteristic value. The candidate condition may be that a characteristic value of a group of first test data blocks is greater than or equal to a synchronization threshold. In an example, a relationship between the synchronization threshold and a quantity of zero elements in syndromes of each group of first test data blocks is sequentially determined, and when it is determined that a quantity of zero elements in syndromes of a group of first test data blocks is greater than or equal to the synchronization threshold, an observed bit corresponding to the group of first test data blocks that meet the candidate condition is used as the candidate bit. A value of the synchronization threshold may be alternatively obtained through simulation analysis.

For example, the characteristic value may be a quantity of zero elements in a syndrome. When the selection manner of traversal is used, the extreme value is correlated with the characteristic value. The extreme value may be a maximum value. In an example, a quantity of zero elements in syndromes of each group of first test data blocks may be counted, a group of first test data blocks with a largest quantity of zero elements are determined, and an observed bit corresponding to the group of first test data blocks is used as the observed bit most likely in a synchronization position.

For example, the characteristic value may be a quantity of non-zero elements in a syndrome. When the selection manner of early termination is used, the candidate condition is correlated with the characteristic value. The candidate condition may be that a characteristic value of a group of first test data blocks is less than or equal to a synchronization threshold. In an example, a relationship between the synchronization threshold and a quantity of non-zero elements in syndromes of each group of first test data blocks is sequentially determined, and when it is determined that a quantity of non-zero elements in syndromes of a group of first test data blocks is less than or equal to the synchronization threshold, an observed bit corresponding to the group of first test data blocks that meet the candidate condition is used as the candidate bit. A value of the synchronization threshold may be alternatively obtained through simulation analysis.

For example, the characteristic value may be a quantity of non-zero elements in a syndrome. When the selection manner of traversal is used, the extreme value is correlated with the characteristic value. The extreme value may be a minimum value. In an example, a quantity of non-zero elements in syndromes of each group of first test data blocks may be counted, a group of first test data blocks with a smallest quantity of non-zero elements are determined, and an observed bit corresponding to the group of first test data blocks is used as the observed bit most likely in a synchronization position.

When the characteristic value is a quantity of a non-all-zero syndrome, a zero element, or a non-zero element in a syndrome, with reference to the specific implementation process of the data sequence shown in FIG. 4, refer to the descriptions when the characteristic value is a quantity of an all-zero syndrome in a syndrome. Details are not described herein again.

Optionally, the characteristic value may be a correctability characteristic value. After obtaining a codeword from a data sequence through division, the receive end can determine a status of the codeword, where the status includes a correctable state and an uncorrectable state. When the codeword is in the correctable state, the codeword is also referred to as a correctable codeword. When the codeword is in the uncorrectable state, the codeword is also referred to as an uncorrectable codeword. Correctability characteristic values of a group of codewords may be correlated with statuses of codewords in the group of codewords. Similarly, for a test data block obtained, through division, from a data sequence received by the receive end, a status of the test data block can also be determined, where the status includes a correctable state and an uncorrectable state. When the test data block is in the correctable state, the test data block is also referred to as a correctable test data block. When the test data block is in the uncorrectable state, the test data block is also referred to as an uncorrectable test data block. Correctability characteristic values of a group of test data blocks may be correlated with statuses of test data blocks in the group of test data blocks.

For example, the correctability characteristic value may be a quantity of correctable test data blocks. When the selection manner of early termination is used, the candidate condition is correlated with the characteristic value. The candidate condition may be that a characteristic value of a group of first test data blocks is greater than or equal to a synchronization threshold. In an example, a relationship between the synchronization threshold and a quantity of correctable test data blocks in each group of first test data blocks is sequentially determined, and when it is determined that a quantity of correctable test data blocks in a group of first test data blocks is greater than or equal to the synchronization threshold, an observed bit corresponding to the group of first test data blocks that meet the candidate condition is used as the candidate bit. A value of the synchronization threshold may be alternatively obtained through simulation analysis.

When the correctability characteristic value is a quantity of correctable test data blocks and the selection manner of early termination is used, for a process of selecting the observed bit most likely in a synchronization position, refer to FIG. 4. The synchronization threshold may be 2. As shown in FIG. 4, a relationship between the synchronization threshold and a quantity of correctable test data blocks in each group of first test data blocks is sequentially determined. For example, a quantity $Q_1$ of correctable test data blocks in a first group of first test data blocks is equal to 0, which is less than the synchronization threshold. A quantity $Q_2$ of correctable test data blocks in a second group of first test data blocks is equal to 2, which is equal to the synchronization threshold. In this case, $b_2$ is selected as the observed bit most likely in a synchronization position. In addition, when determining proceeds to $b_2$, if it is determined that $b_2$ meets the candidate condition, a relationship between the synchronization threshold and a quantity of correctable test data blocks corresponding to a subsequent observed bit is no longer determined, that is, a relationship between $Q_3$ and the synchronization threshold is no longer determined.

For example, the correctability characteristic value may be a quantity of correctable test data blocks. When the selection manner of traversal is used, the extreme value is correlated with the characteristic value. The extreme value may be a maximum value. In an example, a quantity of correctable test data blocks in each group of first test data blocks may be counted, a group of first test data blocks with a largest quantity of correctable test data blocks are determined, and an observed bit corresponding to the group of first test data blocks is used as the observed bit most likely in a synchronization position.

When the correctability characteristic value is a quantity of correctable test data blocks and the selection manner of traversal is used, for a process of selecting the observed bit most likely in a synchronization position, still refer to FIG. 4. As shown in FIG. 4, a quantity of correctable test data blocks in each group of first test data blocks with each of the observed bits $b_1$, $b_2$, and $b_3$ as a start bit is separately counted, and is denoted as $Q_1$, $Q_2$, and $Q_3$ respectively, and a maximum value of the quantities is determined, for example, $Q_1=0$, $Q_2=0$, and $Q_3=2$, and a maximum value is as follows: $Q_3=2$. In this case, $b_3$ is selected as the observed bit most likely in a synchronization position, and a position of $b_3$ is a most likely synchronization position.

For example, the correctability characteristic value may be a quantity of uncorrectable test data blocks. When the selection manner of early termination is used, the candidate condition is correlated with the characteristic value. The candidate condition may be that a characteristic value of a group of first test data blocks is less than or equal to a synchronization threshold. In an example, a relationship between the synchronization threshold and a quantity of uncorrectable test data blocks in each group of first test data blocks is sequentially determined, and when it is determined that a quantity of uncorrectable test data blocks in a group of first test data blocks is less than or equal to the synchronization threshold, an observed bit corresponding to the group of first test data blocks that meet the candidate condition is used as the candidate bit. A value of the synchronization threshold may be alternatively obtained through simulation analysis.

For example, the correctability characteristic value may be a quantity of uncorrectable test data blocks. When the selection manner of traversal is used, the extreme value is correlated with the characteristic value. The extreme value may be a minimum value. In an example, a quantity of uncorrectable test data blocks in each group of first test data blocks may be counted, a group of first test data blocks with a smallest quantity of uncorrectable test data blocks are determined, and an observed bit corresponding to the group of first test data blocks is used as the observed bit most likely in a synchronization position.

Optionally, the characteristic value may be a reconstructed parity characteristic value. The reconstructed parity characteristic value is correlated with a relationship between a reconstructed parity bit and an original parity bit. With reference to the foregoing descriptions, in a codeword with a length of n bits, the first k bits are information bits, and the last n−k bits are parity bits. The parity bits of the last n−k bits are calculated according to a specific encoding rule and based on the information bits of the first k bits. For a data sequence received by the receive end, if a start position of a codeword in the data sequence is not found, a codeword obtained through division no longer meets the foregoing relationship between information bits and parity bits. That is, content that is the same as the last n−k bits in each test data block cannot be obtained according to the same characteristic encoding rule and by using the first k bits as a basis. In each test data block in the data sequence received by the receive end, the last n−k bits and the first k bits may no longer meet the foregoing specific encoding rule. Therefore, the last n−k bits recalculated according to the specific encoding rule and by using the first k bits in each test data block in the data sequence received by the receive end as a basis may be different from the last n−k bits in each test data block in the data sequence received by the receive end. The last n−k bits in each test data block in the data sequence received by the receive end may be referred to as received parity bits. The last n−k bits recalculated according to the specific encoding rule and by using the first k bits in each test data block in the data sequence received by the receive end as a basis may be referred to as reconstructed parity bits.

It can be learned from the foregoing analysis that the reconstructed parity bits are different from the received parity bits when a bit error occurs in the test data block. Therefore, the reconstructed parity bits in each test data block in the data sequence received by the receive end may be compared with the received parity bits, to implement codeword synchronization. In an example, the reconstructed parity bits in each test data block in the data sequence received by the receive end may be compared with the received parity bits, and one observed bit is selected from the plurality of observed bits as the observed bit most likely in a synchronization position.

For example, the reconstructed parity characteristic value may be a quantity of test data blocks whose reconstructed parity bits are the same as received parity bits. When the selection manner of early termination is used, the candidate condition is correlated with the characteristic value. The candidate condition may be: being greater than or equal to a synchronization threshold. In an example, a relationship between the synchronization threshold and a quantity of test data blocks whose reconstructed parity bits are the same as received parity bits in each group of first test data blocks is sequentially determined, and when it is determined that a quantity of test data blocks whose reconstructed parity bits are the same as received parity bits in a group of first test data blocks is greater than or equal to the synchronization threshold, an observed bit corresponding to the group of first test data blocks that meet the candidate condition is used as the candidate bit. A value of the synchronization threshold may be alternatively obtained through simulation analysis.

When the reconstructed parity characteristic value is a quantity of test data blocks whose reconstructed parity bits are the same as received parity bits and the selection manner of early termination is used, for a process of selecting the observed bit most likely in a synchronization position, refer to FIG. 4. The synchronization threshold may be 2. As shown in FIG. 4, a relationship between the synchronization threshold and a quantity of test data blocks whose reconstructed parity bits are the same as received parity bits in each group of first test data blocks is sequentially determined. For example, a quantity $Q_1$ of test data blocks whose reconstructed parity bits are the same as received parity bits in a first group of first test data blocks is equal to 0, which is less than the synchronization threshold. A quantity $Q_2$ of test data blocks whose reconstructed parity bits are the same as received parity bits in a second group of first test data blocks is equal to 2, which is equal to the synchronization threshold. In this case, $b_2$ is selected as the observed bit most likely in a synchronization position. In addition, when determining proceeds to $b_2$, if it is determined that $b_2$ meets the candidate condition, a relationship between the synchronization threshold and a quantity of test data blocks whose reconstructed parity bits are the same as received parity bits and that correspond to a subsequent observed bit is no longer determined, that is, a relationship between $Q_3$ and the synchronization threshold is no longer determined.

For example, the reconstructed parity characteristic value may be a quantity of test data blocks whose reconstructed parity bits are the same as received parity bits. When the selection manner of traversal is used, the extreme value is correlated with the characteristic value. The extreme value may be a maximum value. In an example, a quantity of test data blocks whose reconstructed parity bits are the same as received parity bits in each group of first test data blocks may be counted, a group of first test data blocks with a largest quantity of test data blocks whose reconstructed parity bits are the same as received parity bits are determined, and an observed bit corresponding to the group of first test data blocks is used as the observed bit most likely in a synchronization position.

When the reconstructed parity characteristic value is a quantity of test data blocks whose reconstructed parity bits are the same as received parity bits and the selection manner of traversal is used, for a process of selecting the observed bit most likely in a synchronization position, still refer to FIG. 4. As shown in FIG. 4, a quantity of test data blocks whose reconstructed parity bits are the same as received parity bits in each group of first test data blocks with each of the observed bits $b_1$, $b_2$, and $b_3$ as a start bit is separately counted, and is denoted as $Q_1$, $Q_2$, and $Q_3$ respectively, and a maximum value of the quantities is determined, for example, $Q_1=0$, $Q_2=0$, and $Q_3=2$, and a maximum value is as follows: $Q_3=2$. In this case, $b_3$ is selected as the observed bit most likely in a synchronization position, and a position of $b_3$ is a most likely synchronization position.

For example, the reconstructed parity characteristic value may be a quantity of test data blocks whose reconstructed parity bits are different from received parity bits. When the selection manner of early termination is used, the candidate condition is correlated with the characteristic value. The candidate condition may be: being less than or equal to a synchronization threshold. In an example, a relationship between the synchronization threshold and a quantity of test data blocks whose reconstructed parity bits are different from received parity bits in each group of first test data blocks is sequentially determined, and when it is determined that a quantity of test data blocks whose reconstructed parity bits are different from received parity bits in a group of first test data blocks is less than or equal to the synchronization threshold, an observed bit corresponding to the group of first test data blocks that meet the candidate condition is used as the candidate bit. A value of the synchronization threshold may be alternatively obtained through simulation analysis.

For example, the reconstructed parity characteristic value may be a quantity of test data blocks whose reconstructed parity bits are different from received parity bits. When the selection manner of traversal is used, the extreme value is correlated with the characteristic value. The extreme value may be a minimum value. In an example, a quantity of test data blocks whose reconstructed parity bits are different from received parity bits in each group of first test data blocks may be counted, a group of first test data blocks with a smallest quantity of test data blocks whose reconstructed parity bits are different from received parity bits are determined, and an observed bit corresponding to the group of first test data blocks is used as the observed bit most likely in a synchronization position.

Optionally, synchronization possibility indexes of the plurality of observed bits are respectively determined based on the characteristic values of the plurality of groups of first test data blocks, and a larger value of the synchronization possibility index indicates a higher possibility that a position of the observed bit is a synchronization position. For example, when the characteristic values of the plurality of groups of first test data blocks are a quantity of all-zero syndromes in syndromes of each of the plurality of groups of first test data blocks, the synchronization possibility index may be positively correlated with the quantity of all-zero syndromes. In an example, a larger quantity of all-zero syndromes and a larger value of the synchronization possibility index indicate a higher possibility that a position of the observed bit is a synchronization position. For example, when the characteristic values of the plurality of groups of first test data blocks are a quantity of non-all-zero syndromes in syndromes of each of the plurality of groups of first test data blocks, the synchronization possibility index may be negatively correlated with the quantity of non-all-zero syndromes. In an example, a smaller quantity of non-all-zero syndromes and a larger value of the synchronization possibility index indicate a higher possibility that a position of the observed bit is a synchronization position. Likewise, when the characteristic values of the plurality of groups of first test data blocks are a quantity of zero elements in syndromes of each of the plurality of groups of first test data blocks, or the characteristic values of the plurality of groups of first test data blocks are a quantity of correctable test data blocks in each of the plurality of groups of first test data blocks, or the characteristic values of the plurality of groups of first test data blocks are a quantity of test data blocks whose reconstructed parity bits are the same as received parity bits in each of the plurality of groups of first test data blocks, the synchronization possibility index may be positively correlated with the quantity of the zero elements, the quantity of correctable test data blocks, or the quantity of test data blocks whose reconstructed parity bits are the same as received parity bits; or when the characteristic values of the plurality of groups of first test data blocks are a quantity of non-zero elements in syndromes of each of the plurality of groups of first test data blocks, or the characteristic values of the plurality of groups of first test data blocks are a quantity of uncorrectable test data blocks in each of the plurality of groups of first test data blocks, or the characteristic values of the plurality of groups of first test data blocks are a quantity of test data blocks whose reconstructed parity bits are different from received parity bits in each of the plurality of groups of first test data blocks, the synchronization possibility index may be negatively correlated with the quantity of the non-zero elements, the quantity of uncorrectable test data blocks, or the quantity of test data blocks whose reconstructed parity bits are different from received parity bits. Details are not described herein again.

Optionally, when a quantity of observed bits with a largest value of a synchronization possibility index in the plurality of groups of first test data blocks is greater than 1, one of the observed bits may be selected, based on another condition, as the observed bit most likely in a synchronization position. For example, one observed bit is randomly selected from the observed bits with the largest value of the synchronization possibility index as the observed bit most likely in a synchronization position. For example, an observed bit ranked first in the data sequence is selected from the observed bits with the largest value of the synchronization possibility index as the observed bit most likely in a synchronization position.

S230: In a second stage, perform verification on the candidate bit, and when the verification succeeds, determine that a position of the candidate bit is the synchronization position. In an example, S230 may include two steps: step S231 and step S232.

S231: Obtain a group of second test data blocks from the data sequence through division based on the candidate bit, where the group of second test data blocks include at least one second test data block. The candidate bit is the observed bit most likely in a synchronization position.

Optionally, in the second stage, when at least one second test data block is obtained from the data sequence through division based on the candidate bit in the method, only a part of the data sequence, for example, a second subsequence in the data sequence, may be used. The obtaining a group of second test data blocks from the data sequence through division based on the candidate bit is obtaining a group of second test data blocks from the second subsequence through division based on the candidate bit.

Optionally, the second subsequence may be the same as the first subsequence in the first stage. In an example, all bits of the second subsequence are the same as those of the first subsequence, and the two subsequences completely overlap.

Optionally, the second subsequence may be alternatively partially the same as the first subsequence in the first stage. In an example, some bits of the second subsequence are the same as those of the first subsequence, and the two subsequences partially overlap. Optionally, the second subsequence may be alternatively different from the first subsequence in the first stage. In an example, all bits of the second subsequence are different from those of the first subsequence, and the two subsequences have no intersection.

A smaller intersection between data used in the first stage and data used in the second stage indicates higher independence between the data used in the first stage and the data used in the second stage, and higher accuracy of a codeword synchronization result. Therefore, when the first subsequence is different from the second subsequence, accuracy of a codeword synchronization result is higher.

In the second stage, a group of second test data blocks are obtained from the second subsequence through division based on the candidate bit, namely, the observed bit most likely in a synchronization position, and the group of second test data blocks include at least one second test data block.

Obtaining a group of second test data blocks from the second subsequence through division based on the candidate bit may include using the candidate bit as a start bit of the at least one second test data block, to obtain the at least one second test data block through division.

Alternatively, obtaining a group of second test data blocks from the second subsequence through division based on the observed bit most likely in a synchronization position may include using the observed bit most likely in a synchronization position as a start bit of a test data block, to divide the second subsequence into a plurality of test data blocks; and selecting at least one test data block from the plurality of test data blocks as the at least one second test data block. In this case, there are several test data blocks between the at least one second test data block and the observed bit most likely in a synchronization position, and the at least one second test data block may be located before or after the observed bit most likely in a synchronization position.

Optionally, the at least one second test data block may be consecutive. In an example, the at least one second test data block includes N consecutive data blocks. When a length of each test data block is n bits, N×n consecutive bits after the observed bit are selected, to obtain the at least one second test data block.

Optionally, the at least one second test data block may be alternatively inconsecutive, and a start position of each of the at least one second test data block is correlated with a candidate bit. In an example, an interval between the start position of each test data block and the candidate bit is an integer multiple of a length of a codeword, that is, intervals between every two test data blocks in the at least one second test data block are integer multiples of the length of the codeword. In addition, the intervals between every two test data blocks in the at least one second test data block may be the same or different.

S232: Perform verification on a characteristic value of the at least one second test data block, and when the verification succeeds, determine that the position of the candidate bit is the synchronization position.

Optionally, verification is performed on the characteristic value of the at least one second test data block, and a verification manner may be a verification manner of early termination. In an example, a characteristic value of each of the at least one second test data block is sequentially accumulated to obtain a cumulative value; and when the cumulative value meets a synchronization condition, the verification succeeds, and it is determined that the position of the candidate bit is the synchronization position.

The synchronization condition is correlated with the characteristic value. In an example, the characteristic value is a quantity of all-zero syndromes in syndromes, and the synchronization condition is that the cumulative value is greater than or equal to a synchronization threshold; or the characteristic value is a quantity of zero elements in a syndrome, and the synchronization condition is that the cumulative value is greater than or equal to a synchronization threshold; or the characteristic value is a quantity of correctable test data blocks, and the synchronization condition is that the cumulative value is greater than or equal to a synchronization threshold; or the characteristic value is a quantity of test data blocks whose reconstructed parity bits are the same as received parity bits, and the synchronization condition is that the cumulative value is greater than or equal to a synchronization threshold, where a value of the synchronization threshold may be alternatively obtained through simulation analysis, and the synchronization threshold in step 230 and the synchronization threshold in step 2222 may have a same value or different values.

Optionally, verification is performed on the characteristic value of the at least one second test data block, and a verification manner may be a verification manner of traversal. In an example, characteristic values of all of the at least one second test data block are added up to obtain a total value; and when the total value meets a synchronization condition, the verification succeeds, and it is determined that the position of the candidate bit is the synchronization position.

The synchronization condition is correlated with the characteristic value. In an example, the characteristic value is a quantity of all-zero syndromes in syndromes, and the synchronization condition is that the total value is greater than or equal to a synchronization threshold; or the characteristic value is a quantity of non-all-zero syndromes in syndromes, and the synchronization condition is that the total value is less than or equal to a synchronization threshold; or the characteristic value is a quantity of zero elements in a syndrome, and the synchronization condition is that the total value is greater than or equal to a synchronization threshold; or the characteristic value is a quantity of non-zero elements in a syndrome, and the synchronization condition is that the total value is less than or equal to a synchronization threshold; or the characteristic value is a quantity of correctable test data blocks, and the synchronization condition is that the total value is greater than or equal to a synchronization threshold; or the characteristic value is a quantity of uncorrectable test data blocks, and the synchronization condition is that the total value is less than or equal to a synchronization threshold; or the characteristic value is a quantity of test data blocks whose reconstructed parity bits are the same as received parity bits, and the synchronization condition is that the total value is greater than or equal to a synchronization threshold; or the characteristic value is a quantity of test data blocks whose reconstructed parity bits are different from received parity bits, and the synchronization condition is that the total value is less than or equal to a synchronization threshold, where a value of the synchronization threshold may be alternatively obtained through simulation analysis, and the synchronization threshold in step 230 and the synchronization threshold in step 2222 may have a same value or different values.

In the verification manner of early termination and the verification manner of traversal, characteristic values may be calculated in parallel. In an example, a plurality of calculation units are used to simultaneously calculate characteristic values of a plurality of test data blocks. For example, 10 calculation units are used to simultaneously calculate characteristic values of 10 test data blocks. In the parallel calculation manner, a calculation time can be shortened, and a latency can be reduced.

Figure 8A:
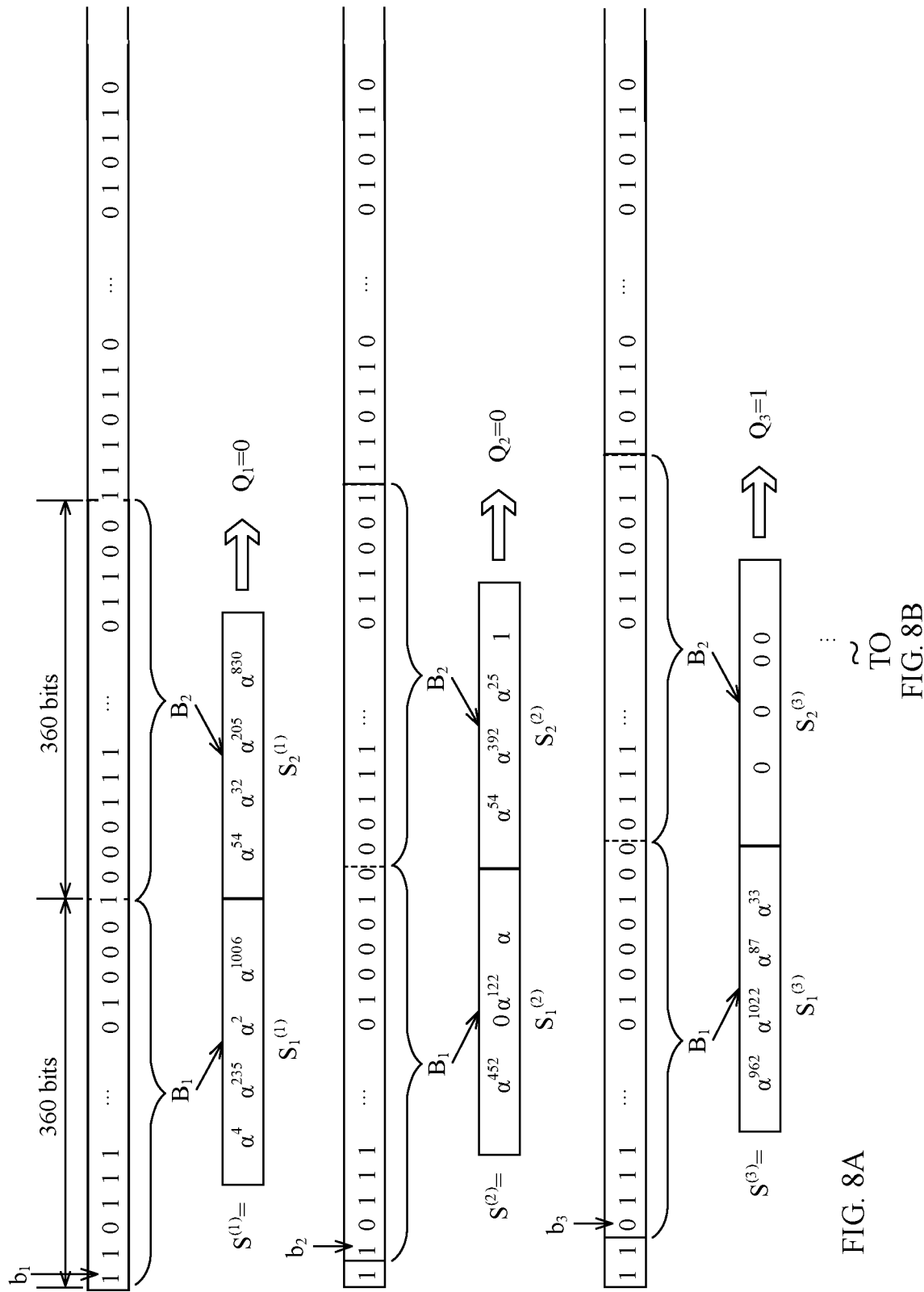
Figure 9:
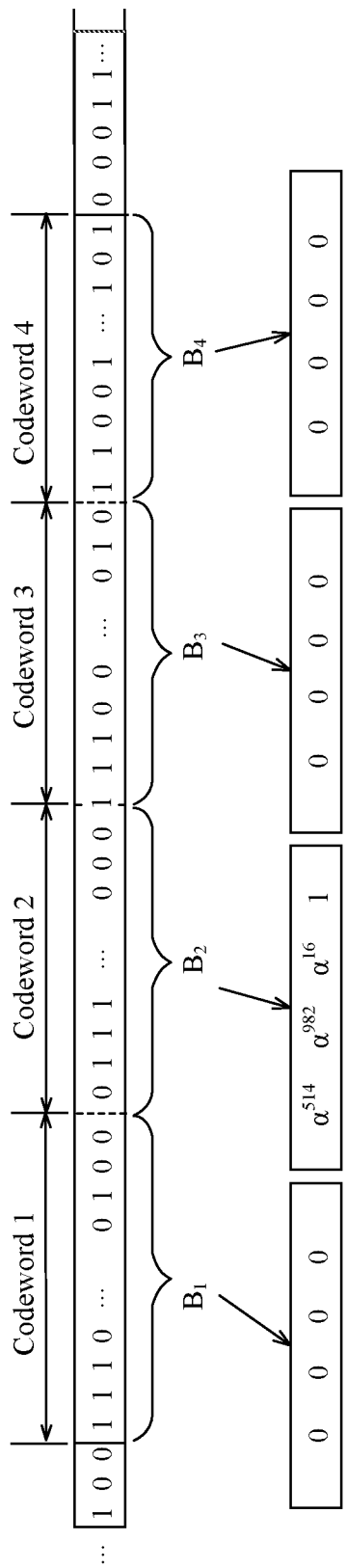
FIG. 9 shows a second stage of synchronization lock determining according to an embodiment of this application.

FIG. 8A to FIG. 9 show an example process of determining the observed bit most likely in a synchronization position in the data sequence and verifying whether the position of the observed bit most likely in a synchronization position is a synchronization position. A linear block code shown in FIG. 8A and FIG. 8B is a BCH (360, 340) code. In an example, a length of each codeword is 360 bits, and a length of information data in each codeword is 340 bits. A modulation scheme of the BCH (360, 340) code is a non-return-to-zero (NRZ) code, and a modulation order M is 2. In this case, each symbol includes one bit. A parity-check matrix for the BCH (360, 340) code is shown as follows:

$$H = \begin{bmatrix} \alpha^{359} & \alpha^{358} & \ldots & \alpha^2 & \alpha^1 & 1 \\ (\alpha^2)^{359} & (\alpha^2)^{358} & \ldots & (\alpha^2)^2 & (\alpha^2)^1 & 1 \\ (\alpha^3)^{359} & (\alpha^3)^{358} & \ldots & (\alpha^3)^2 & (\alpha^3)^1 & 1 \\ (\alpha^4)^{359} & (\alpha^4)^{358} & \ldots & (\alpha^4)^2 & (\alpha^4)^1 & 1 \end{bmatrix},$$

where $\alpha$ is a primitive element of a Galois field GF ($2^{10}$).

FIG. 8A and FIG. 8B show a part of the data sequence received by the receive end, and a start position, namely, a synchronization position, of a codeword in the data sequence needs to be determined. With reference to the foregoing descriptions, in the first stage, the observed bit most likely in a synchronization position in the data sequence is determined. As shown in FIG. 8A and FIG. 8B, in the first stage, a start bit of a modulated symbol is selected at an interval of T $\log_2$M bits as an observed bit, where T is 1, that is, a start bit of a modulated symbol is selected at an interval of 1 bit as an observed bit. Therefore, 360 consecutive bits are selected as observed bits, that is, a quantity P of observed bits is 360, for example, $b_1$, $b_2$, $b_3$, ..., $b_{359}$, and $b_{360}$ shown in FIG. 8A and FIG. 8B. A plurality of groups of first test data blocks are obtained from the data sequence through division based on the observed bits. A quantity N of test data blocks in each group of first test data blocks is 2, that is, each group of first test data blocks include two test data blocks, for example, a plurality of groups of $B_1$ and $B_2$ shown in FIG. 8A and FIG. 8B.

With reference to the foregoing descriptions, in positions of the plurality of observed bits in the data sequence shown in FIG. 8A and FIG. 8B, only a position of one observed bit is a real synchronization position of the data sequence. A quantity of all-zero syndromes in syndromes of each group of first test data blocks is used as a basis for selecting the observed bit most likely in a synchronization position. As shown in FIG. 8A and FIG. 8B, a syndrome S is a row vector with a length of 4. For example, a syndrome set of a group of first test data blocks with an observed bit $b_1$ as a start bit is $S^{(1)}$, including $S_1^{(1)}$ and $S_2^{(1)}$, corresponding to the test data blocks $B_1$ and $B_2$ respectively. Similarly, a syndrome set of a group of first test data blocks with each of the observed bits $b_2$, $b_3$, ..., $b_{359}$, and $b_{360}$ as a start bit is $S^{(2)}$, $S^{(3)}$, ..., $S^{(359)}$, and $S^{(360)}$ respectively. A quantity of all-zero syndromes in syndromes of each group of first test data blocks is counted, and denoted as $Q_1$, $Q_2$, $Q_3$, ..., $Q_{359}$, and $Q_{360}$ respectively. As shown in FIG. 8A and FIG. 8B, $Q_1$=0, in an example, there is no all-zero syndrome in the syndromes of the group of first test data blocks with the observed bit $b_1$ as a start bit. Similarly, $Q_2$=0, $Q_3$=1, ..., $Q_{359}$=2, and $Q_{360}$=0. Assuming that the value of $Q_{359}$ is eventually the largest in all the 360 Q values, the observed bit $b_{359}$ is used as the observed bit most likely in a synchronization position. In an example, the observed bit $b_{359}$ is considered as a start bit of a test data block, and a bit at an interval of every 360 bits after the observed bit is a start bit of a subsequent test data block.

After $b_{359}$ is selected as the observed bit most likely in a synchronization position, a group of second test data blocks are obtained, through division based on $b_{359}$, after the part of the data sequence used in the first stage, namely, the first subsequence. That is, a group of second test data blocks are obtained from the second subsequence through division, where the second subsequence is different from the first subsequence. As shown in FIG. 9, the group of second test data blocks include four test data blocks. Verification is performed on the characteristic value of the at least one second test data block, where the characteristic value is a quantity of all-zero syndromes in syndromes of the at least one second test data block. The verification manner of traversal is used. In an example, a total quantity of all-zero syndromes in syndromes of all of the at least one second test data block is calculated to obtain a total value; and when the total value is greater than or equal to a synchronization threshold, the verification succeeds, where the synchronization threshold is 2. As shown in FIG. 9, in syndromes of the four test data blocks, a quantity of all-zero syndromes is 3, which is greater than 2. Therefore, it is determined that a position of $b_{359}$ is the synchronization position.

Optionally, when the verification fails, step S220 is performed again. In an example, the first stage is performed again, and the observed bit most likely in a synchronization position is re-selected.

Step S230 is an optional step, in other words, the method may include only the first stage. In this case, step S240 is directly performed after step S220. In this case, in the method, after the candidate bit is determined, the position of the candidate bit is directly determined as the synchronization position. That is, the most likely synchronization position is directly used as the synchronization position.

S240: Determine that the data sequence is in a synchronization lock state.

After determining the synchronization position, the receive end may divide the received data sequence into a plurality of synchronization codewords based on the synchronization position. When the data sequence is divided into a plurality of synchronization codewords based on the synchronization position, it may be considered that the data sequence is in the synchronization lock state. That is, after the synchronization position is determined, the receive end determines that the data sequence is in the synchronization lock state. When the data sequence is in the synchronization lock state, the receive end may perform operations such as error detection and error correction on the data sequence.

S250: Perform out-of-lock determining.

After the receive end starts to perform operations such as error detection and error correction on the data sequence, the receive end still needs to continuously observe whether codeword division in the data sequence is accurate, that is, whether the synchronization position is accurate. When the synchronization position is inaccurate, content of each test data block obtained through division based on the synchronization position no longer corresponds to a real codeword. This case may also be referred to as that the synchronization lock state of the data sequence is lost. Therefore, a process of determining whether the synchronization position of the data sequence is accurate may also be referred to as an out-of-lock determining process.

In the out-of-lock determining process, a plurality of synchronization codewords are obtained from the data sequence through division based on the synchronization position, where the synchronization position is a start position of the plurality of synchronization codewords; and verification is performed on characteristic values of the plurality of synchronization codewords, and when the verification fails, it is determined that the data sequence is in the out-of-lock state.

Optionally, the plurality of synchronization codewords may be consecutive, that is, the plurality of synchronization codewords include N consecutive codewords. When a length of each codeword is n bits, N×n consecutive bits after the synchronization position are selected, to obtain the plurality of synchronization codewords.

Optionally, the plurality of synchronization codewords may be alternatively inconsecutive, and a start position of each of the plurality of synchronization codewords is correlated with the synchronization position. In an example, an interval between the synchronization position and the start position of each synchronization codeword is an integer multiple of the length of the codeword, that is, intervals between every two of the plurality of synchronization codewords are integer multiples of the length of the codeword. In addition, the intervals between every two of the plurality of synchronization codewords may be the same or different.

Optionally, verification is performed on characteristic values of the plurality of synchronization codewords, and a verification manner may be a verification manner of early termination. In an example, a characteristic value of each of the plurality of synchronization codewords is sequentially accumulated to obtain a cumulative value; and when the cumulative value meets an out-of-lock condition, the verification fails, and it is determined that the position of the candidate bit is the synchronization position.

The out-of-lock condition is correlated with the characteristic value. In an example, the characteristic value is a quantity of non-all-zero syndromes in syndromes, and the out-of-lock condition is that the cumulative value is greater than or equal to a synchronization threshold; or the characteristic value is a quantity of non-zero elements in a syndrome, and the out-of-lock condition is that the cumulative value is greater than or equal to a synchronization threshold; or the characteristic value is a quantity of uncorrectable codewords, and the out-of-lock condition is that the cumulative value is greater than or equal to a synchronization threshold; or the characteristic value is a quantity of codewords whose reconstructed parity bits are different from received parity bits, and the out-of-lock condition is that the cumulative value is greater than or equal to a synchronization threshold, where the length of the codeword is n bits, the first k bits of the codeword are information bits, the last n−k bits of the codeword are the received parity bits, the reconstructed parity bits are obtained based on the information bits, a length of the reconstructed parity bits is n−k bits, and n and k are integers.

A value of the synchronization threshold may be alternatively obtained through simulation analysis. In addition, the synchronization threshold in step 250 and the synchronization thresholds in steps 230 and 2222 may have a same value or different values.

Optionally, verification is performed on characteristic values of the plurality of synchronization codewords, and a verification manner may be a verification manner of traversal. In an example, characteristic values of all of the plurality of synchronization codewords are added up to obtain a total value; and when the total value meets an out-of-lock condition, the verification fails, and it is determined that the position of the candidate bit is the synchronization position.

The out-of-lock condition is correlated with the characteristic value. In an example, the characteristic value is a quantity of all-zero syndromes in syndromes, and the out-of-lock condition is that the total value is less than or equal to a synchronization threshold; or the characteristic value is a quantity of non-all-zero syndromes in syndromes, and the out-of-lock condition is that the total value is greater than or equal to a synchronization threshold; or the characteristic value is a quantity of zero elements in a syndrome, and the out-of-lock condition is that the total value is less than or equal to a synchronization threshold; or the characteristic value is a quantity of non-zero elements in a syndrome, and the out-of-lock condition is that the total value is greater than or equal to a synchronization threshold; or the characteristic value is a quantity of correctable codewords, and the out-of-lock condition is that the total value is less than or equal to a synchronization threshold; or the characteristic value is a quantity of uncorrectable codewords, and the out-of-lock condition is that the total value is greater than or equal to a synchronization threshold; or the characteristic value is a quantity of codewords whose reconstructed parity bits are the same as received parity bits, and the out-of-lock condition is that the total value is less than or equal to a synchronization threshold; or the characteristic value is a quantity of codewords whose reconstructed parity bits are different from received parity bits, and the out-of-lock condition is that the total value is greater than or equal to a synchronization threshold, where the length of the codeword is n bits, the first k bits of the codeword are information bits, the last n−k bits of the codeword are the received parity bits, the reconstructed parity bits are obtained based on the information bits, a length of the reconstructed parity bits is n−k bits, and n and k are integers.

A value of the synchronization threshold may be alternatively obtained through simulation analysis. In addition, the synchronization threshold in step 250 and the synchronization thresholds in steps 230 and 2222 may have a same value or different values.

In the verification manner of early termination and the verification manner of traversal, characteristic values may be calculated in parallel. In an example, a plurality of calculation units is used to simultaneously calculate characteristic values of a plurality of test data blocks. For example, 10 calculation units are used to simultaneously calculate characteristic values of 10 test data blocks. In the parallel calculation manner, a calculation time can be shortened, and a latency can be reduced.

Figure 10:
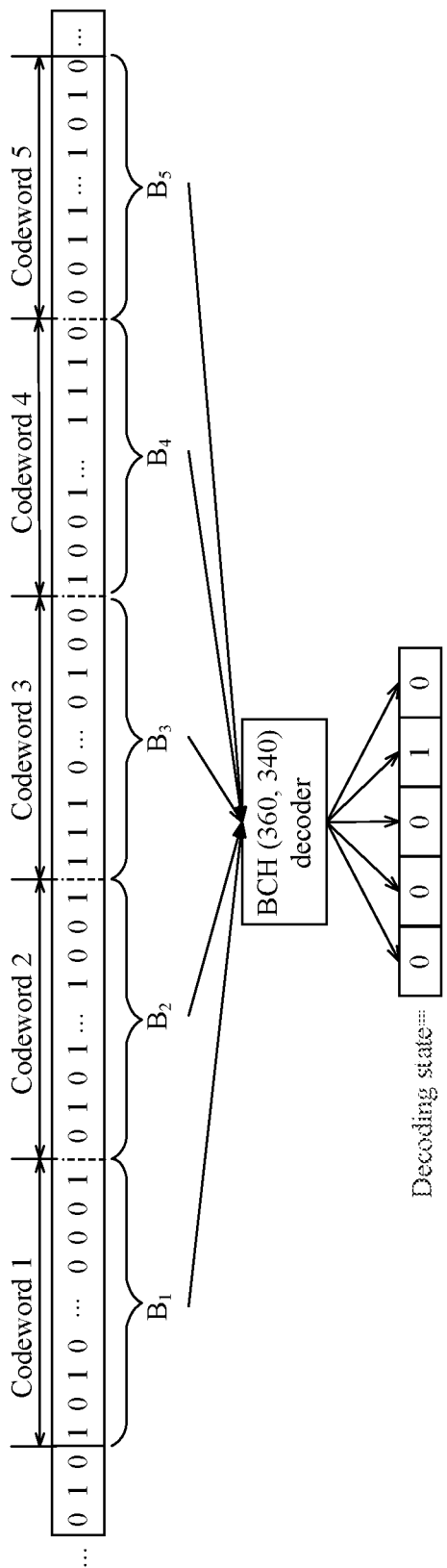
FIG. 10 shows synchronization out-of-lock determining according to an embodiment of this application.

FIG. 10 shows an example process of out-of-lock determining. As shown in FIG. 10, five synchronization codewords are obtained from the data sequence through division based on the synchronization position, and a quantity of correctable codewords in the synchronization codewords is counted. For example, in a decoding state, 0 indicates being uncorrectable, and 1 indicates being correctable. In this case, in the five synchronization codewords shown in FIG. 10, a quantity of correctable codewords is 1. If an out-of-lock threshold is 3, the quantity of correctable codewords is less than the out-of-lock threshold, and it is determined that the five synchronization codewords meet the out-of-lock condition, and the data sequence is in the out-of-lock state.

Optionally, when the verification does not fail, it is determined that the synchronization lock state of the data sequence is not lost.

Optionally, after it is determined that the synchronization lock state of the data sequence is not lost, a plurality of synchronization codewords may be selected by continuing to move backward at a specific interval in the data sequence, and whether the plurality of synchronization codewords selected backward meet the out-of-lock condition is further determined. Optionally, the moving backward at a specific interval may be moving by one test data block. In an example, starting from each synchronization codeword, a plurality of synchronization codewords after the synchronization codeword are observed to perform out-of-lock determining.

S260: Determine that the data sequence is in the out-of-lock state.

Optionally, when it is determined that the data sequence is in the out-of-lock state, an updated synchronization position of the data sequence is further determined. In an example, the first stage and the second stage are performed again, and a synchronization position determined in the second stage performed again is used as the updated synchronization position. In this way, a closed-loop operation of synchronization lock-out-of-lock-synchronization lock is formed, thereby ensuring that a communication system is in a normal operating state of synchronization lock for as much time as possible.

With this method, technical problems that additional data is added and cascading scalability is poor in an AM synchronization solution can be resolved. In addition, no additional data needs to be inserted into a data stream at the transmit end, and therefore no idle code block addition and deletion mechanism needs to be introduced into an Ethernet interface, no corresponding logic processing unit needs to be designed, and no bandwidth needs to be reserved in advance for an inserted AM sequence. If a level of FEC needs to be added based on original FEC and two-level cascading FEC is used, the following technical problems can be avoided: An original idle code block addition and deletion mechanism is not applicable to an AM sequence for second-level FEC, and high-precision clock synchronization performance is affected by adding the AM sequence for the second-level FEC. With this method, a technical effect of high-precision codeword synchronization for a data stream at the receive end can be achieved, and synchronization performance achieves high reliability.

Steps S240, S250, and S260 are all optional steps. In an example, the method may be used only to determine the synchronization position, without performing error detection or error correction processing on the data sequence in the synchronization lock state, or without determining whether the data sequence subsequently enters the out-of-lock state.

Through simulation comparison, the codeword synchronization method provided in this application is compared with the conventional AM synchronization solution, and the codeword synchronization method provided in this application is superior to the conventional AM synchronization solution in the following performance indexes: an average synchronization lock time, an average occurrence time of mis-lock, an average occurrence time of mis-out-of-lock, and the like. Therefore, from an overall perspective, the codeword synchronization method provided in this application can achieve higher synchronization performance than the AM synchronization solution.

Figure 11:
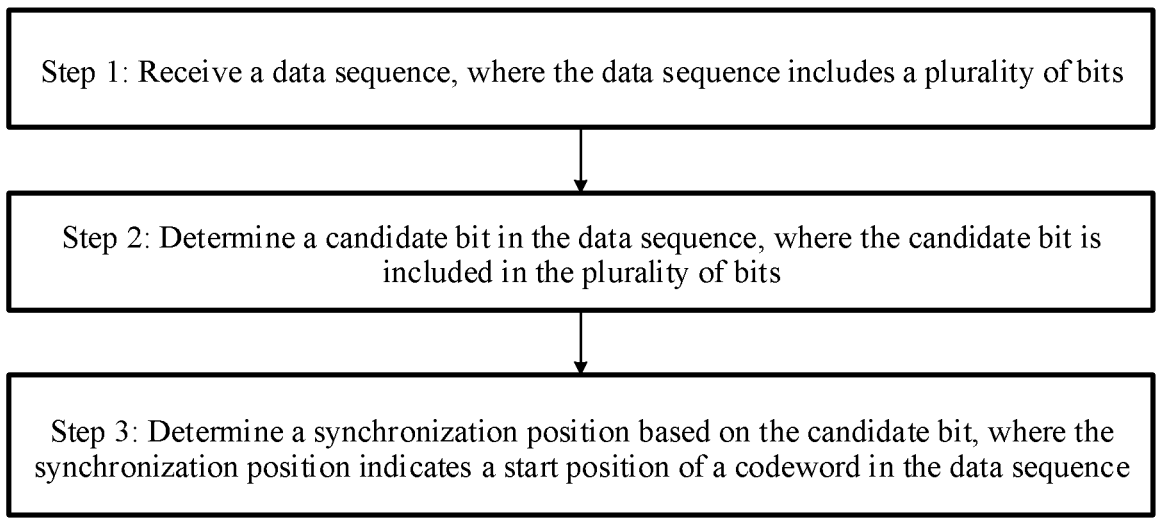
FIG. 11 is a synchronization flowchart according to an embodiment of this application.

FIG. 11 shows a codeword synchronization method according to an embodiment of this application. The method includes the following steps.

Step 1: Receive a data sequence, where the data sequence includes a plurality of bits. For a specific process of step 1, refer to the foregoing descriptions of step S210.

Step 2: Determine a candidate bit in the data sequence, where the candidate bit is included in the plurality of bits. The candidate bit is an observed bit most likely in a synchronization position. For an example process of step 2, refer to the foregoing descriptions of step S220.

Step 3: Determine a synchronization position based on the candidate bit, where the synchronization position indicates a start position of a codeword.

Optionally, the determining a synchronization position based on the candidate bit may be: after the observed bit most likely in a synchronization position is selected, further verifying whether a position of the observed bit most likely in a synchronization position is a synchronization position. The candidate bit is the observed bit most likely in a synchronization position. In this case, for an example process of step 3, refer to the foregoing descriptions of step S230. In this case, the method includes at least S210, S220, and S230 shown in FIG. 2.

Optionally, the determining a synchronization position based on the candidate bit may be alternatively: after the observed bit most likely in a synchronization position is selected, directly using the observed bit most likely in a synchronization position as a synchronization position. The candidate bit is the observed bit most likely in a synchronization position. In this case, the method includes at least S210 and S220 shown in FIG. 2.

It can be learned that in the foregoing two manners of determining the synchronization position based on the candidate bit, a bit in the synchronization position is included in the candidate bit, and the candidate bit is the observed bit most likely in a synchronization position.

Optionally, after step 3, the method further includes: determining that the data sequence is in a synchronization lock state. For an example process, refer to the foregoing descriptions of step S240.

Optionally, after step 3, the method further includes: performing out-of-lock determining. For an example process, refer to the foregoing descriptions of step S250.

Optionally, the method may further include step 4: In response to that the data sequence is in an out-of-lock state, determine an updated synchronization position of the data sequence. For an example process, refer to the foregoing descriptions of step S260.

The codeword synchronization method in this embodiment of this application is performed by a communication device. The communication device may be any device for performing FEC, including but not limited to a router, a switch, a server, and a terminal device.

Figure 12:
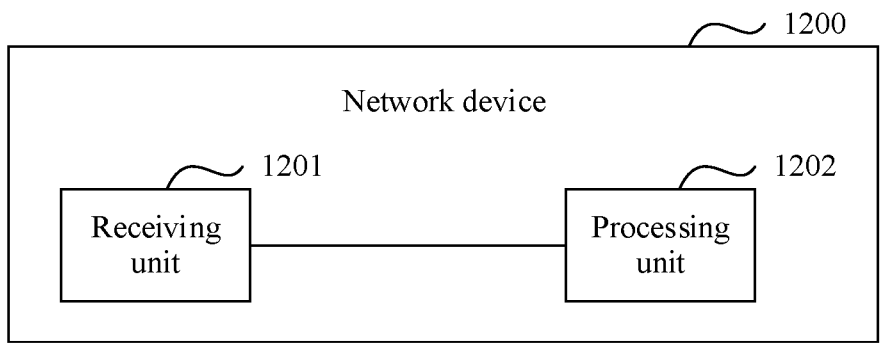
FIG. 12 is a schematic diagram of a structure of a communication device according to an embodiment of this application.

FIG. 12 is a schematic diagram of a possible structure of a communication device according to an embodiment of this application. As shown in FIG. 12, the communication device 1200 includes a receiving unit 1201 and a processing unit 1202. These units may perform corresponding steps of the method shown in FIG. 2 to FIG. 11. For example, the receiving unit 1201 is configured to receive a data sequence, where the data sequence includes a plurality of bits; and the processing unit 1202 is configured to: determine a candidate bit in the data sequence, where the candidate bit is included in the plurality of bits; and determine a synchronization position based on the candidate bit, where the synchronization position indicates a start position of a codeword in the data sequence.

Figure 13:
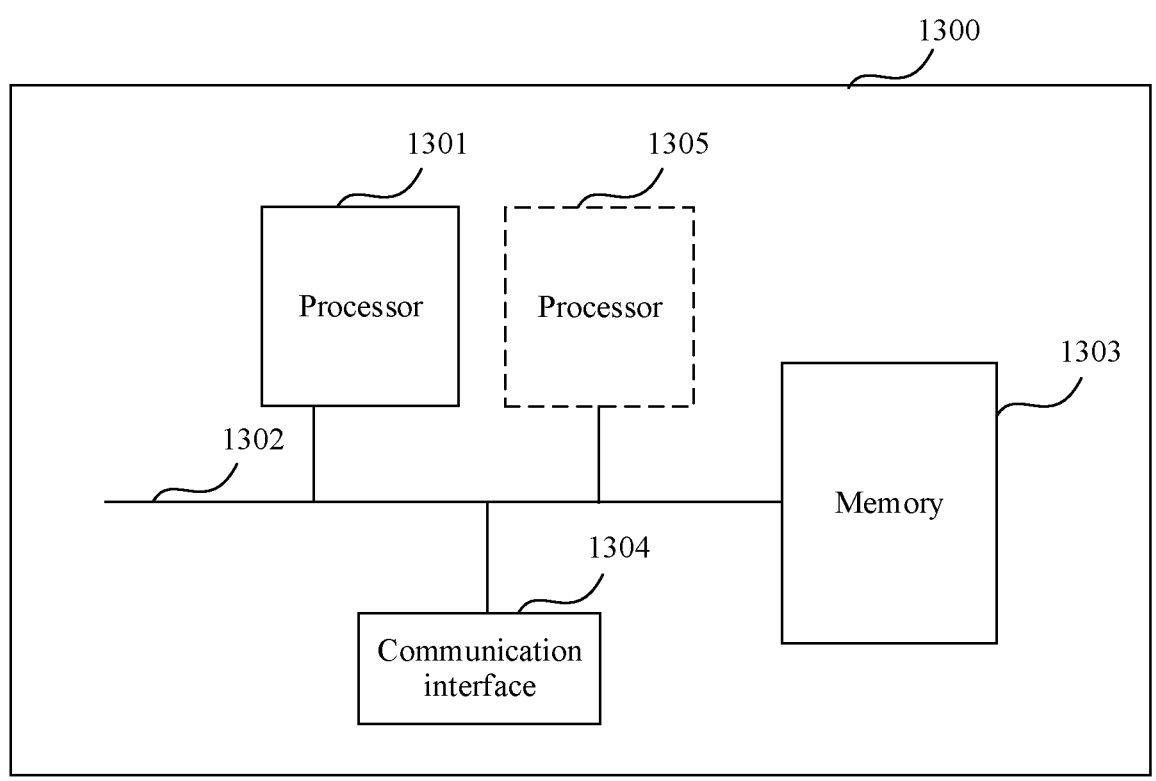
FIG. 13 is a schematic diagram of a structure of a communication device according to an embodiment of this application.

FIG. 13 is a schematic diagram of another structure of a communication device according to an embodiment of this application. As shown in FIG. 13, the communication device 1300 includes at least one processor 1301 and at least one communication interface 1304. Optionally, the device 1300 may further include a memory 1303.

The processor 1301 may be a central processing unit (CPU), a general-purpose processor, a digital signal processor (DSP), an application-specific integrated circuit (ASIC), a field-programmable gate array (FPGA) or another programmable logic device, a transistor logic device, a hardware component, or any combination thereof. The processor may implement or execute various logical blocks, modules, and circuits described with reference to content disclosed in this embodiment of this application. Alternatively, the processor may be a combination of processors implementing a computing function, for example, a combination of one or more microprocessors, or a combination of a DSP and a microprocessor. The processor may be configured to determine a candidate bit in a data sequence, and determine a synchronization position based on the candidate bit, to implement the method provided in embodiments of this application.

Optionally, the communication bus 1302 is configured to transmit information between the processor 1301, the communication interface 1304, and the memory 1303. The bus may be a Peripheral Component Interconnect (PCI) bus, an Extended Industry Standard Architecture (EISA) bus, or the like. The bus may be classified into an address bus, a data bus, a control bus, and the like. For ease of representation, only one thick line is used to represent the bus in FIG. 13, but this does not mean that there is only one bus or only one type of bus.

The memory 1303 may be a read-only memory (ROM) or another type of static storage device that can store static information and instructions, or a random-access memory (RAM) or another type of dynamic storage device that can store information and instructions, or may be an electrically erasable programmable read-only memory (EEPROM), a compact disc read-only memory (CD-ROM) or another optical disk storage, an optical disc storage (including a compact disc, a laser disc, an optical disc, a digital versatile disc, a Blu-ray® disc, or the like), a disk storage medium or another magnetic storage device, or any other medium that can be used to carry or store expected program code in a form of instructions or a data structure and that can be accessed by a computer. However, the memory 1303 is not limited thereto. The memory 1303 may exist independently and is connected to the processor 1301 by using the communication bus 1302. Alternatively, the memory 1303 may be integrated with the processor 1301.

Optionally, the memory 1303 is configured to store program code or instructions for performing solutions of this application, and the processor 1301 controls execution of the program code or instructions. When the embodiment shown in FIG. 12 is implemented and the units described in the embodiment of FIG. 12 are implemented by software, software or program code required for performing functions of the units in FIG. 12 is stored in the memory 1303. The processor 1301 is configured to execute the program code stored in the memory 1303. The program code may include one or more software modules. Optionally, the processor 1301 may alternatively store program code or instructions for performing solutions of this application.

The communication interface 1304 is configured to communicate with another device or a communication network by using any apparatus like a transceiver. The communication network may be Ethernet, a radio access network (RAN), a wireless local area network (WLAN), or the like. In this embodiment of this application, the communication interface 1304 may be configured to receive a packet sent by another node on a segment routing network, or may send a packet to another node on a segment routing network. The communication interface 1304 may be an Ethernet interface, a Fast Ethernet (FE) interface, a Gigabit Ethernet (GE) interface, or an asynchronous transfer mode (ATM) interface.

In a specific implementation, in an embodiment, the device 1300 may include a plurality of processors, for example, the processor 1301 and a processor 1305 shown in FIG. 13. Each of the processors may be a single-core (single-CPU) processor or a multi-core (multi-CPU) processor. Herein, the processor may be one or more devices, circuits, and/or processing cores configured to process data (for example, computer program instructions).

In an embodiment, the processor 1301 in the network device 1300 is configured to: receive a data sequence by using the communication interface, where the data sequence includes a plurality of bits; determine a candidate bit in the data sequence, where the candidate bit is included in the plurality of bits; and determine a synchronization position based on the candidate bit, where the synchronization position indicates a start position of a codeword in the data sequence. For a processing procedure of the processor, refer to the detailed descriptions of steps S210, S220, S230, S240, S250, and S260 in the embodiment shown in FIG. 2, steps S221 and S222 in the embodiment shown in FIG. 3, and steps 1 to 3 shown in FIG. 11. Details are not described herein again.

The communication interface in the network device 1300 is used for the network device 1300 to receive and send a data sequence by using a network system. For an example process, refer to the detailed descriptions of S210 in the embodiment shown in FIG. 2 and step 1 shown in FIG. 11. Details are not described herein again.

Figure 14:
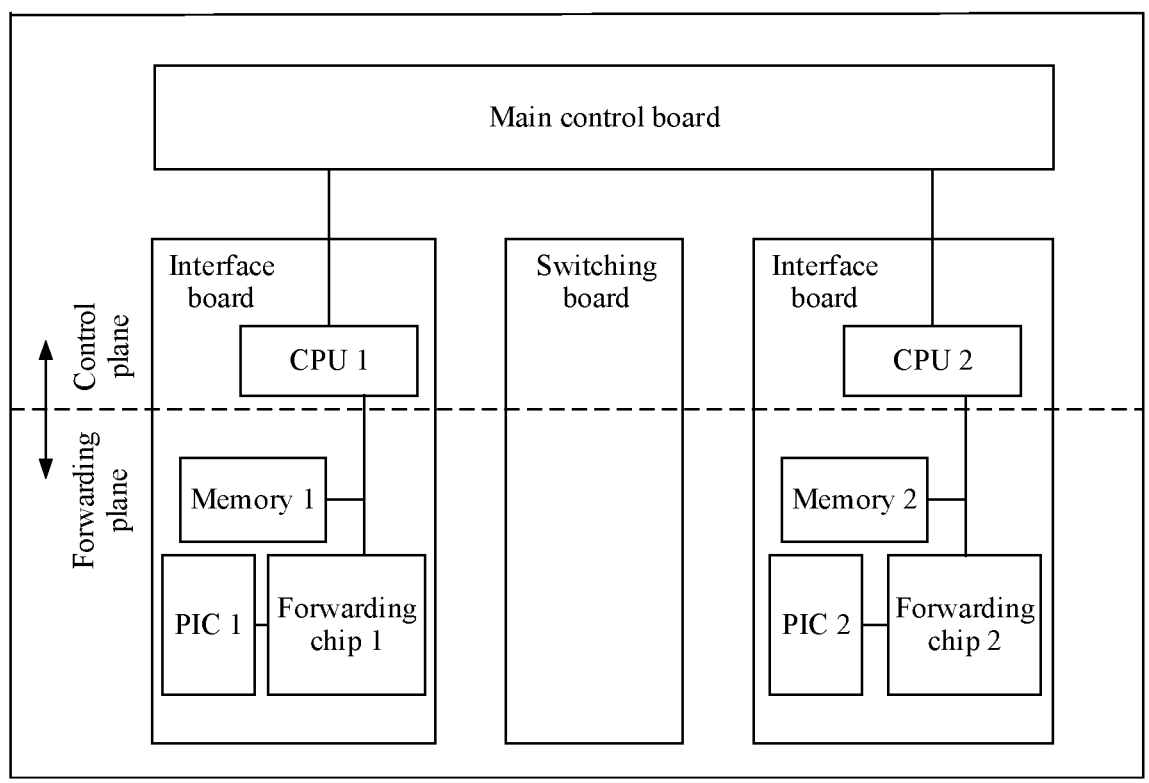
FIG. 14 is a schematic diagram of a structure of a communication device according to an embodiment of this application.

FIG. 14 is a schematic diagram of another structure of a communication device according to an embodiment of this application. When the communication device is a forwarding device on a network, for example, a router or a switch, for the communication device, refer to the schematic diagram of the structure of the device shown in FIG. 14. The device 1400 includes a main control board and one or more interface boards, and the main control board is communicatively connected to the interface boards. The main control board is also referred to as a main processing unit (MPU) or a route processor card (route processor card). The main control board is responsible for control and management of components in the device 1400, including functions of route calculation and device management and maintenance. The interface board is also referred to as a line processing unit (LPU) or a line card, and is configured to forward data. In some embodiments, the device 1400 may further include a switching board. The switching board is communicatively connected to the main control board and the interface board. The switching board is configured to forward data between interface boards. The switching board may also be referred to as a switch fabric unit (SFU). The interface board includes a central processing unit, a memory, a forwarding chip, and a physical interface card (PIC). The central processing unit is communicatively connected to the memory, a network processor, and the physical interface card. The memory is configured to store a forwarding table. The forwarding chip is configured to forward a received data frame based on the forwarding table stored in the memory. If a destination address of the data frame is an address of the device 1400, the data frame is sent to the CPU for processing. If the destination address of the data frame is not the address of the device 1400, a next hop and an outbound interface corresponding to the destination address are found in the forwarding table based on the destination address, and the data frame is forwarded to the outbound interface corresponding to the destination address. The forwarding chip may be a network processor (NP). The PIC is also referred to as a subcard, and may be mounted on the interface board and responsible for converting an optical or electrical signal into a data frame, checking validity of the data frame, and then forwarding the data frame to the forwarding chip for processing. In some embodiments, the central processing unit may alternatively perform a function of a forwarding chip. For example, software forwarding is implemented based on a general CPU, so that no forwarding chip is required in the interface board. A communication connection between the main control board, the interface board, and the switching board may be implemented by using a bus. In some embodiments, the forwarding chip may be implemented by an ASIC or an FPGA.

Logically, the device 1400 includes a control plane and a forwarding plane, where the control plane includes a main control board and a central processing unit, and the forwarding plane includes various components for performing forwarding, for example, a memory, a PIC, and an NP. The control plane performs functions such as routing, generating a forwarding table, processing signaling and protocol packets, and configuring and maintaining a status of a PE 1. The control plane delivers the generated forwarding table to the forwarding plane. At the forwarding plane, based on the forwarding table delivered by the control plane, the NP searches the forwarding table and forwards a packet received by the PIC of the device 1400. The forwarding table delivered by the control plane may be stored in the memory. In some embodiments, the control plane and the forwarding plane may be completely separate on different devices.

In a specific embodiment, the interface board is configured to receive a data sequence, where the data sequence includes a plurality of bits. For a specific process, refer to the detailed descriptions of S210 in the embodiment shown in FIG. 2 and step 1 shown in FIG. 11. Details are not described herein again. The main control board is configured to determine a candidate bit in the data sequence, where the candidate bit is included in the plurality of bits; and determine a synchronization position based on the candidate bit, where the synchronization position indicates a start position of a codeword in the data sequence. For a detailed processing procedure, refer to the detailed descriptions of steps S210, S220, S230, S240, S250, and S260 in the embodiment shown in FIG. 2, steps S221 and S222 in the embodiment shown in FIG. 3, and steps 1 to 3 shown in FIG. 11. Details are not described herein again.

In a possible implementation, an Inter-Process Communication (IPC) Protocol channel is established between the main control board and the interface board, and the main control board and the interface board communicate with each other through the IPC channel.

An embodiment of this application provides a chip. The chip includes a memory and a processor. The memory is configured to store a computer program. The processor is configured to invoke the computer program from the memory and run the computer program, to perform the methods in the foregoing method embodiments, namely, the methods in the embodiments shown in FIG. 2 to FIG. 11.

Optionally, the chip includes only a processor. The processor is configured to read a computer program stored in a memory and execute the computer program. When the computer program is executed, the processor performs the methods in the foregoing method embodiments, namely, the methods in the embodiments shown in FIG. 2 to FIG. 11.

Optionally, the chip may be used in an application scenario of two-level cascading FEC. In an example, the two-level cascading FEC includes inner-layer FEC and outer-layer FEC. The chip provided in this embodiment of this application is used for the inner-layer FEC. The codeword synchronization method described in this application is used for the inner-layer FEC, which is also referred to as FEC 1. The AM synchronization solution may be used for the outer-layer FEC, which is also referred to as FEC 2. In this case, the FEC 1 and the FEC 2 may be located on one chip or different chips. That is, the chip provided in this embodiment of this application may include only the FEC 1, or may include the FEC 1 and the FEC 2.

An embodiment of this application provides a network system. The network system includes a receiving device and a sending device. The receiving device is configured to receive a data sequence sent by the sending device. The receiving device may perform the steps in the embodiments shown in FIG. 2 to FIG. 11.

An embodiment of this application further provides a non-transitory storage medium, configured to store software instructions used in the foregoing embodiments. The non-transitory storage medium includes a program used to perform the methods shown in the foregoing embodiments. When the program is executed on a computer or a network device, the computer or the network device is enabled to perform the methods in the foregoing method embodiments.

An embodiment of this application further provides a computer program product including computer program instructions. When the computer program product runs on a computer, a network node is enabled to perform the methods in the foregoing method embodiments.

It should be noted that any apparatus embodiment described above is merely an example. The units described as separate parts may or may not be physically separate, and parts displayed as units may or may not be physical units, may be located in one position, or may be distributed on a plurality of network units. Some or all of the modules may be selected based on actual requirements to achieve the objectives of the solutions of embodiments. In addition, in accompanying drawings of embodiments of a network device or a host provided in this application, a connection relationship between modules indicates that there is a communication connection between the modules, and the communication connection may be implemented as one or more communication buses or signal lines. A person of ordinary skill in the art may understand and implement embodiments without creative efforts.

Methods or algorithm steps described in the content disclosed in this embodiment of this application may be implemented by hardware, or may be implemented by a processor by executing software instructions. The software instructions may include a corresponding software module. The software module may be stored in a RAM, a flash memory, a ROM, an erasable programmable read-only memory (EPROM), an EEPROM, a hard disk, a removable hard disk, a compact disc, or any other form of storage medium well-known in the art. The storage medium is coupled to the processor, so that the processor can read information from the storage medium. Certainly, the storage medium may be a component of the processor.

The foregoing specific implementations further describe the purpose, the technical solutions, and the beneficial effects of this application in detail. It should be understood that the foregoing descriptions are merely specific implementations of this application, but are not intended to limit the protection scope of this application. Any modification, replacement, or improvement made based on the technical solutions of this application should fall within the protection scope of this application.

In this application, the terms "first", "second", and the like are used to distinguish between same items or similar items that have a basically same usage and function. It should be understood that "first", "second", and "$n^{th}$" do not have a dependency relationship in logic or timing, and do not limit a quantity or an execution sequence either. It should be further understood that although the terms first, second, and the like are used to describe various elements in the following descriptions, these elements should not be limited by the terms. These terms are used only to distinguish one element from another element. For example, a first image may be referred to as a second image, and similarly, a second image may be referred to as a first image, without departing from the scope of the various examples. Both the first image and the second image may be images, and in some cases, may be separate and different images.

In this application, the term "at least one" means one or more. In this application, the term "a plurality of" means two or more. For example, a plurality of second packets mean two or more second packets. In this specification, the terms "system" and "network" are usually used interchangeably.

It should be understood that the terms used in the descriptions of the various examples in this specification are merely intended to describe specific examples, but are not intended to set a limitation. As used in the descriptions of the various examples and in the appended claims, the singular forms "a ("a" or "an")" and "the" are intended to also include plural forms, unless otherwise expressly specified in the context.

It should be understood that, the term "and/or" used in this specification indicates and includes any or all possible combinations of one or more items in associated listed items. The term "and/or" describes only an association relationship for describing associated objects and indicates that three relationships may exist. For example, A and/or B may indicate the following three cases: Only A exists, both A and B exist, and only B exists. In addition, the character "/" in this application generally indicates an "or" relationship between the associated objects.

It should be understood that sequence numbers of the foregoing processes do not mean execution sequences in embodiments of this application. The execution sequences of the processes should be determined based on functions and internal logic of the processes, and should not constitute any limitation on implementation processes of embodiments of this application.

However, it should be understood that determining B based on A does not mean that B is determined based on only A. B may alternatively be determined based on A and/or other information.

It should be further understood that, when used in this specification, the term "include" (also referred to as "includes", "including", "comprises", and/or "comprising") indicates presence of stated features, entireties, steps, operations, elements, and/or components, but does not exclude presence or addition of one or more other features, integers, steps, operations, elements, components, and/or groups thereof.

It should be further understood that the term "if" may be interpreted as "when" ("when" or "upon"), "in response to determining", or "in response to detecting". Similarly, according to the context, the phrase "if it is determined that" or "if (a stated condition or event) is detected" may be interpreted as a meaning of "when it is determined that", "in response to determining", "when (a stated condition or event) is detected", or "in response to detecting (a stated condition or event)".

It should be understood that "one embodiment", "an embodiment", or "a possible implementation" mentioned throughout this specification means that a specific feature, structure, or characteristic related to the embodiment or implementation is included in at least one embodiment of this application. Therefore, "in one embodiment", "in an embodiment", or "a possible implementation" appearing throughout this specification does not necessarily mean a same embodiment. In addition, these particular features, structures, or characteristics may be combined in one or more embodiments in any appropriate manner.

What is claimed is:

1. A codeword synchronization method, comprising:
receiving a data sequence, wherein the data sequence comprises a plurality of bits;
determining a candidate bit from among the plurality of bits based on a characteristic value of at least one group of first test data blocks, wherein each group of the at least one group of the first test data blocks comprises multiple first test data blocks, and wherein an interval between a start position of each first test data block in a first group of the at least one group of the first test data blocks and the candidate bit is an integer multiple of a length of a codeword; and
determining a synchronization position based on the candidate bit,
wherein the synchronization position indicates a start position of a codeword in the data sequence.

2. The codeword synchronization method of claim 1, wherein determining the synchronization position further comprises:
performing verification based on the candidate bit; and
determining that a position of the candidate bit is the synchronization position when the verification is successful.

3. The codeword synchronization method of claim 1, wherein determining the synchronization position further comprises:
obtaining, multiple second test data blocks from the data sequence based on the candidate bit, wherein the position of the candidate bit is a second start position of the multiple second test data blocks, or is a position where several data blocks are between the start position of the multiple second test data blocks and the candidate bit;
performing verification on a characteristic value of the multiple second test data blocks; and
determining that the position of the candidate bit is the synchronization position when the verification of the characteristic value of the multiple second test data blocks is successful.

4. The codeword synchronization method of claim 3, wherein determining the candidate bit from among the plurality of bits in the data sequence further comprises determining a first candidate bit in a first subsequence of the data sequence, wherein the multiple second test data blocks is obtained from a second subsequence of the data sequence, wherein the first subsequence and the second subsequence are different subsequences.

5. The codeword synchronization method of claim 3, wherein performing the verification on the characteristic value of the multiple second test data blocks comprises sequentially accumulating a characteristic value of each of the multiple second test data blocks to obtain a cumulative value, wherein the verification is successful when the cumulative value meets a synchronization condition.

6. The codeword synchronization method of claim 1, wherein determining the synchronization position further comprises using a position of the candidate bit as the synchronization position.

7. The codeword synchronization method of claim 1, wherein after determining the synchronization position based on the candidate bit, the codeword synchronization method further comprises determining an updated synchronization position of the data sequence when the data sequence is in an out-of-lock state.

8. The codeword synchronization method of claim 7, wherein determining the updated synchronization position of the data sequence further comprises:
  determining another candidate bit among the plurality of bits in the data sequence;
  determining another synchronization position based on the another candidate bit to obtain a start position of another codeword in the data sequence; and
  using the another synchronization position as the updated synchronization position.

9. The codeword synchronization method of claim 7, wherein after determining the synchronization position based on the candidate bit and before determining the updated synchronization position of the data sequence, the codeword synchronization method further comprises:
  obtaining, a plurality of synchronization codewords from the data sequence based on the synchronization position, wherein the synchronization position is a start position of the plurality of synchronization codewords;
  performing verification on characteristic values of the plurality of synchronization codewords; and
  determining that the data sequence is in the out-of-lock state when the verification is a failure.

10. The codeword synchronization method of claim 1, wherein the data sequence is a linear block code.

11. The codeword synchronization method of claim 1, wherein the characteristic value is a quantity of all-zero syndromes.

12. A communication device comprising:
  at least one memory; and
  at least one processor coupled to the at least one memory and configured to:
    receive a data sequence, wherein the data sequence comprises a plurality of bits;
    determine a candidate bit from among the plurality of bits based on a characteristic value of at least one group of first test data blocks, wherein each group of the at least one group of the first test data blocks comprises multiple first test data blocks, and wherein an interval between a start position of each first test data block in a first group of the at least one group of the first test data blocks and the candidate bit is an integer multiple of a length of a codeword; and
    determine a synchronization position based on the candidate bit, wherein the synchronization position indicates a start position of a codeword in the data sequence.

13. The communication device of claim 12, wherein the at least one processor is further configured to:
  perform verification based on the candidate bit; and
  determine that a position of the candidate bit is the synchronization position when the verification is successful.

14. The communication device of claim 13, wherein the at least one processor is further configured to:
  obtain, multiple second test data blocks from the data sequence based on the candidate bit, wherein the position of the candidate bit is a start position of the multiple second test data blocks or is a position where several data blocks are between the start position of the multiple second test data blocks and the candidate bit;
  perform verification on a characteristic value of the multiple second test data blocks; and
  determine that the position of the candidate bit is the synchronization position when the verification on the characteristic value of the multiple second test data blocks is successful.

15. The communication device of claim 14, wherein the at least one processor is further configured to:
  determine the candidate bit from among the plurality of bits in a first subsequence of the data sequence; and
  obtain, the multiple second test data blocks from a second subsequence of the data sequence based on the candidate bit, wherein the first subsequence and the second subsequence are comprised in the data sequence, and wherein the second subsequence is either the same as the first subsequence, partially the same as the first subsequence, or different from the first subsequence.

16. The communication device of claim 14, wherein the at least one processor is further configured to sequentially accumulate a characteristic value of each of the multiple second test data blocks to obtain a cumulative value, wherein the verification is successful when the cumulative value meets a synchronization condition.

17. The communication device of claim 12, wherein the at least one processor is further configured to use a position of the candidate bit as the synchronization position.

18. The communication device of claim 12, wherein the at least one processor is further configured to: determine an updated synchronization position of the data sequence when the data sequence is in an out-of-lock state.

19. The communication device of claim 18, wherein the at least one processor is further configured to:
  determining another candidate bit among the plurality of bits in the data sequence;
  determining another synchronization position based on the another candidate bit to obtain a start position of another codeword in the data sequence; and
  using the another synchronization position as the updated synchronization position.

20. The communication device of claim 12, wherein the characteristic value is a quantity of all-zero syndromes.

21. The communication device of claim 12, wherein a length of the first test data block is a length of the codeword.

22. A chip, comprising:
  at least one processor,
  wherein the at least one processor is configured to:
    receive a data sequence, wherein the data sequence comprises a plurality of bits;
    determine a candidate bit from among the plurality of bits based on a characteristic value of at least one group of first test data blocks, wherein each group of the at least one group of the first test data blocks comprises multiple first test data blocks, and wherein an interval between a start position of each first test data block in a first group of the at least one group of the first test data blocks and the candidate bit is an integer multiple of a length of a codeword; and determine a synchronization position based on the candidate bit, wherein the synchronization position indicates a start position of a codeword in the data sequence.

23. The chip of claim 22, wherein the at least one processor is further configured to:

perform verification based on the candidate bit; and determine that a position of the candidate bit is the synchronization position when the verification is successful.

24. The chip of claim 23, wherein the at least one processor is further configured to:

obtain, multiple second test data blocks from the data sequence based on the candidate bit, wherein the position of the candidate bit is a start position of the multiple second test data blocks or is a position where several data blocks are between the start position of the multiple second test data blocks and the candidate bit;

perform verification on a characteristic value of the multiple second test data blocks; and determine that the position of the candidate bit is the synchronization position when the verification on the characteristic value of the multiple second test data blocks is successful.

25. The chip of claim 24, wherein the at least one processor is further configured to:

determine the candidate bit in a first subsequence of the data sequence; and obtain, the multiple second test data blocks from a second subsequence of the data sequence based on the candidate bit, wherein the first subsequence and the second subsequence are comprised in the data sequence, and wherein the second subsequence is either the same as the first subsequence, partially the same as the first subsequence, or different from the first subsequence.

26. The chip of claim 24, wherein the at least one processor is further configured to sequentially accumulate a characteristic value of each of the multiple second test data blocks to obtain a cumulative value, wherein the verification is successful when the cumulative value meets a synchronization condition.

27. The chip of claim 22, wherein the at least one processor is further configured to use a position of the candidate bit as the synchronization position.

28. The chip of claim 22, wherein the at least one processor is further configured to determine an updated synchronization position of the data sequence when the data sequence is in an out-of-lock state.

29. The chip of claim 28, wherein the at least one processor is further configured to:

determining another candidate bit among the plurality of bits in the data sequence;

determining another synchronization position based on the another candidate bit to obtain a start position of another codeword in the data sequence; and using the another synchronization position as the updated synchronization position.

30. The chip of claim 22, wherein the characteristic value is a quantity of all-zero syndromes.

* * * * *